US009343264B2

(12) United States Patent
Kotaki et al.

(10) Patent No.: US 9,343,264 B2
(45) Date of Patent: May 17, 2016

(54) SCANNING ELECTRON MICROSCOPE DEVICE AND PATTERN DIMENSION MEASURING METHOD USING SAME

(75) Inventors: Go Kotaki, Kumamoto (JP); Atsushi Miyamoto, Yokohama (JP); Ryoichi Matsuoka, Yotsukaido (JP)

(73) Assignee: HITACHI HIGH-TECHNOLOGIES CORPORATION, Tokyo (JP)

( * ) Notice: Subject to any disclaimer, the term of this patent is extended or adjusted under 35 U.S.C. 154(b) by 786 days.

(21) Appl. No.: 13/379,042

(22) PCT Filed: Jul. 1, 2010

(86) PCT No.: PCT/JP2010/004338
§ 371 (c)(1),
(2), (4) Date: Jan. 10, 2012

(87) PCT Pub. No.: WO2011/007516
PCT Pub. Date: Jan. 20, 2011

(65) Prior Publication Data
US 2012/0098953 A1  Apr. 26, 2012

(30) Foreign Application Priority Data
Jul. 17, 2009 (JP) .................................. 2009-168771

(51) Int. Cl.
G06K 9/00 (2006.01)
G01N 23/00 (2006.01)
G21K 7/00 (2006.01)
H01J 37/28 (2006.01)
H04N 5/232 (2006.01)
H01J 37/22 (2006.01)
H01L 21/66 (2006.01)

(52) U.S. Cl.
CPC ............... H01J 37/28 (2013.01); H01J 37/222 (2013.01); H04N 5/23238 (2013.01); H01J 2237/2817 (2013.01); H01L 22/12 (2013.01); H01L 2924/0002 (2013.01)

(58) Field of Classification Search
None
See application file for complete search history.

(56) References Cited

U.S. PATENT DOCUMENTS

2002/0158199 A1    10/2002  Takane et al.
2003/0126566 A1*    7/2003  Saito .................................. 716/4
2004/0136582 A1*    7/2004  Bacus et al. .................. 382/128
2005/0205780 A1     9/2005  Nakagaki et al.

(Continued)

FOREIGN PATENT DOCUMENTS

JP    2002-50572     2/2002
JP    2002-328015    11/2002

(Continued)

Primary Examiner — Christopher S Kelley
Assistant Examiner — Rebecca Volentine
(74) Attorney, Agent, or Firm — Baker Botts L.L.P.

(57) ABSTRACT

In a panoramic image construction technology a wide-range imaging area (EP) of semiconductor patterns is divided into a plurality of imaging areas (SEP), and joined a group of images, which are obtained by imaging the SEPs using an SEM, through image processing. Although a pattern serving as a key to joining is not contained in an overlap area between some of the SEPs, all the images can be joined in some cases is noted so that: although the number of patterns serving as keys to joining is small, SEPs whose images are all joined can be determined; or even if such SEPs cannot be determined, SEPs satisfying user's request items as many as possible can be determined. The cases are extracted by optimizing an SEP arrangement, whereby the number of cases in which SEPs whose images are all joined can be determined is increased.

9 Claims, 25 Drawing Sheets

(56) References Cited

U.S. PATENT DOCUMENTS

| | | |
|---|---|---|
| 2006/0193508 A1* | 8/2006 | Sutani .................. H01J 37/265 382/145 |
| 2006/0284081 A1* | 12/2006 | Miyamoto et al. ............ 250/307 |
| 2007/0098302 A1* | 5/2007 | Yamamoto .................. 382/300 |
| 2007/0120056 A1* | 5/2007 | Nagatomo et al. ............ 250/310 |
| 2007/0210252 A1 | 9/2007 | Miyamoto et al. |
| 2008/0159609 A1* | 7/2008 | Miyamoto et al. ............ 382/128 |
| 2009/0022419 A1* | 1/2009 | Molnar et al. ................ 382/275 |
| 2009/0039263 A1* | 2/2009 | Matsuoka et al. ............ 250/311 |

FOREIGN PATENT DOCUMENTS

| | | |
|---|---|---|
| JP | 2004-128197 | 4/2004 |
| JP | 2005-265424 | 9/2005 |
| JP | 2007-64842 | 3/2007 |
| JP | 2007-248087 | 9/2007 |
| JP | 2007-250528 | 9/2007 |
| JP | 2009-157543 | 7/2009 |
| JP | 2010-67516 | 3/2010 |

\* cited by examiner 1204-1  1204-2
1204-3  1204-4

1205

SCANNING ELECTRON MICROSCOPE DEVICE AND PATTERN DIMENSION MEASURING METHOD USING SAME

TECHNICAL FIELD

The present invention relates to a device that for acquiring a wide-range and high-resolution image using a scanning electron microscope, divides an imaging area into plural local areas, images the local areas, produces a panoramic image by joining the pickup images of the local areas through image processing, and measures a dimension of a pattern, and a method therefor. In particular, the present invention is concerned with a scanning electron microscope capable of determining imaging positions of the local areas and an imaging magnification, which offer high joining precision, and a pattern dimension measuring method using it.

BACKGROUND ART

For producing wiring patterns on a semiconductor wafer, such a method is adopted that: a liniment called a resist is applied to the semiconductor wafer; an exposure mask (reticle) for the wiring patterns is superposed on the resist; visible rays, ultraviolet rays, or an electron beam is irradiated to the resultant resist in order to expose the resist to light for development; the wiring patterns of the resist are thus formed on the semiconductor wafer; and the wiring patterns of the resist are used as a mask to perform etching on the semiconductor wafer so as to form the wiring patterns.

For investigation of a mask or a pattern shape on a wafer, a critical dimension scanning electron microscope (CD-SEM) that is a type of scanning electron microscope is widely used. For evaluation of the pattern shape, coordinates at which SEM imaging is performed are called an evaluation point that is abbreviated to an EP. In order to image the EP with a small imaging deviation volume and with high image quality, part or all of adjustment points such as an addressing point (hereinafter, an AP), an autofocus point (hereinafter, an AF), an auto-stigma point (hereinafter, an AST), and an auto-brightness/contrast point (hereafter, an ABCC) are set if necessity. At the respective adjustment points, addressing, autofocusing, auto-stigma adjustment, or auto-brightness/contrast adjustment is carried out. Thereafter, the EP is imaged.

As for an imaging deviation volume in addressing, an SEM image at an AP which is registered in advance as a registration template and whose coordinates are known is matched against an SEM image observed in an actual imaging sequence, and a deviation volume in the matching is compensated as a deviation volume of an imaging position. The evaluation point (EP) and adjustment points (AP, AF, AST, and ABCC) shall be generically called imaging points. The size and coordinates of the EP, imaging conditions for the EP, the imaging conditions for the adjustment points, an imaging method, an imaging order (or an adjustment order) for the imaging points, and the registration template are managed as an imaging recipe. Based on the imaging recipe, the SEM images the EP.

In the past, an SEM operator has manually composed a recipe, and the work has been labor-intensive and time-consuming. For determining adjustment points or registering a registration template in a recipe, it is necessary to actually image a wafer at a low magnification. Composition of the recipe has become a factor for decreasing the working ratio of an SEM device. Further, along with a tendency toward finer and more complex patterns, the number of EPs requested to be evaluated has explosively increased. The manual composition of the recipe has become unrealistic from the viewpoints of labor and composition time.

A semiconductor inspection system in which: an AP is determined based on design information on semiconductor circuit patterns described in, for example, the GDS II format; and data at the AP is cut out from the design information, and registered in an imaging recipe as a registration template has been disclosed in Japanese Patent Laid-Open No. 2002-328015 (hereinafter, patent document 1). Herein, it is unnecessary to image an actual wafer only for the purpose of determining the AP and registering the registration template. The working ratio of an SEM improves. In addition, the semiconductor inspection system has such a function that: when an SEM image (actual imaging template) at the AP is acquired in an actual imaging sequence, the actual imaging template is matched against the registration template in the design information; the SEM image associated with the position of the registration template in the design information is re-registered as a registration template in the imaging recipe; and the registration template of the re-registered SEM image is employed in addressing processing. Further, the semiconductor inspection system has such a function that a characteristic pattern portion is automatically detected from the design information and registered as an AP.

Japanese Patent Laid-Open No. 2005-265424 (hereinafter, patent document 2) describes that an image obtained by imaging an addressing pattern at about a several-tens-of-thousands-fold magnification is compared with a preliminarily stored addressing template image in order to obtain the position of the addressing pattern; central coordinates of a length-measurement area are acquired based on the obtained positional information; and an enlarged image of a length-measurement position is acquired at a several hundred-of-thousands-fold magnification on the basis of the central coordinates information.

Further, Japanese Patent laid-Open No. 2007-250528 (hereinafter, patent document 3) describes, as a method for automatically composing an imaging recipe for use in imaging a specimen using an SEM, that coordinates of an EP, a size thereof, a shape thereof, imaging conditions therefor, and CAD data on the surroundings of the EP are inputted in order to compose the imaging recipe, which includes the number of imaging points for use in observing the EP, coordinates of the imaging points, sizes thereof, shapes thereof, an imaging sequence, and imaging conditions, in a wafer-less manner.

As an EP, a user-designated point, or a risky spot which is outputted from an electronic design automation (EDA) tool, which is called as a hot spot, and at which a device malfunction is likely to occur is cited. Based on a pattern dimension value at the EP, feedback is performed in order to correct the shape of a mask pattern or modify the conditions for a semiconductor fabrication process. Thus, a high yield is attained. In response to a need for a high speed and high integration of semiconductor devices, miniaturization and densification of wiring patterns has made progress and a super resolution exposure technology represented by optical proximity correction (OPC) has been introduced. Since mask patterns are getting more complex accordingly, prediction of simulation of pattern shapes to be transferred to a wafer or inspection of the actually transferred pattern shapes has become more important.

CITATION LIST

Patent Literature

Japanese Patent Laid-Open No. 2002-328015
Japanese Patent Laid-Open No. 2005-265424
Japanese Patent Laid-Open No. 2007-250528

SUMMARY OF INVENTION

Technical Problem

For predicting simulation of pattern shapes to be transferred to a wafer, it is necessary to input the pattern shapes on a mask. In order to perform simulation with an optical proximity effect added, pattern shapes in a somewhat wide range have to be inputted. A method of inputting design information as the pattern shapes is conceivable. However, since the design information is dissociated from the pattern shapes actually produced on a mask, the dissociation results in a simulation error. Conceivably, patterns produced on a mask are imaged with an SEM in order to extract the shapes. However, if imaging is performed at a low magnification in order to cover the wide range, an image resolution is degraded. In contrast, if imaging is performed at a high magnification, although the resolution is upgraded, a field of view gets narrower. Conceivably, a wide imaging range (EP) is divided into plural local areas and then imaged, and the pickup images of the local areas are joined through image processing in order to produce a wide-range and high-resolution panoramic image (an image constructed by joining plural adjoining images). The local areas shall be called segmental evaluation points (SEPs) because they are areas into which the EP is divided.

For example, for performing simulation with an optical proximity effect added, information obtained from one high-magnification image provided by an SEM is insufficient. Therefore, it is necessary to obtain a high-magnification image of a relatively wide range, that is, a high-magnification image covering plural fields of view. However, any of the patent documents 1 to 3 does not describe that a high-magnification image is obtained to cover a relatively wide range.

In general, combining images of local areas and constructing a panoramic image that is a wide-area image is well-known processing. Unlike panoramic synthesis of images picked up by, for example, a CCD camera, panoramic image construction processing for semiconductor patterns using an SEM has inherent problems described below.

(1) Joining images is performed based on a pattern contained in an overlap area between SEPs. Semiconductor patterns do not densely exist, and only an edge of the pattern is basically used as a key to joining. Therefore, there is a possibility that a pattern serving as the key to joining may not be fully contained in all overlap areas among SEPs. For SEPs having an overlap area in which the pattern is not fully contained (or no pattern is contained), there is a risk that joining precision gets lower (or joining is impossible). For example, when an EP of a field of view of 10 μm is segmented into SEPs each of which is a field of view of 1.5 μm, the number of SEPs is on the order of fifty. Using a limited number of patterns, all of such numerous SEPs have to be successfully joined.

(2) In principle, an SEP arrangement satisfying all user requests (for example, all SEPs have to be joined through image processing) may not exist. Even in such a case, an SEP arrangement satisfying the user requests as many as possible should preferably be determined as a quasi-optimal solution. However, work of evaluating a degree of satisfaction of the user requests while looking at the fifty SEPs is not easy to do. For predicting simulation of pattern shapes to be transferred to a wafer with an optical proximity effect added, there is a method and a necessity of imaging the pattern shapes in a somewhat wide-range area on a mask at a relatively high magnification and inputting the resultant images. However, for performing simulation with the optical proximity effect added, it is necessary to input pattern shapes in a somewhat wide range.

An object of the present invention is to provide an SEM device capable of addressing the foregoing problems underlying prior arts, producing a high-magnification SEM image, which covers a relatively wide range, by joining plural high-magnification SEM images, and processing the high-magnification SEM image of the relatively wide range so as to measure a dimension of a pattern.

Solution to Problem

In order to address the aforesaid problems, the present invention provides a scanning electron microscope (SEM) device having features to be described later, and a method of acquiring a wide-area image of semiconductor mask patterns or circuit patterns, which are obtained by transferring the mask patterns to a wafer, using the SEM device, and measuring a desired dimension of a pattern (a line width of a pattern, a length of a pattern, a gap between patterns, a roundness of a corner of a pattern, or the like).

Specifically, according to an embodiment of the present invention, there is provided a scanning electron microscope device including a scanning electron microscope, a processor that composes an imaging recipe for imaging a specimen, which has patterns formed on the surface thereof, using the scanning electron microscope, and that processes an image of the specimen, which is obtained by imaging the specimen using the scanning electron microscope, on the basis of the composed imaging recipe, a dimensional information extractor that extracts dimensional information on the pattern, which is formed on the specimen, from the image of the specimen processed by the processor, an input/output unit that inputs or outputs information to be processed by the image processor of dimensional information extractor or information processed thereby, and a control unit that controls the microscope, processor, dimensional information extractor, and input/output unit. Herein, the scanning electron microscope sequentially images plural adjoining areas on the specimen according to the imaging recipe composed by the processor while superposing parts of the adjoining areas, and thus acquires plural images. The processor produces a panoramic image which has the plural images, which are acquired by the scanning electron microscope, joined using pieces of edge information on patterns existent in overlap areas among the images. The dimensional information extractor extracts dimensional information on a pattern from the panoramic image produced by the image processor.

In addition, according to an embodiment of the present invention, there is provided a scanning electron microscope device including a scanning electron microscope, an imaging recipe composer that composes an imaging recipe for imaging a specimen, which has patterns formed on the surface thereof, using the scanning electron microscope, an image processor that processes an image of the specimen obtained by imaging the specimen using the scanning electron microscope on the basis of the imaging recipe composed by the imaging recipe composer, a dimensional information extractor that extracts dimensional information on a pattern, which is formed on the specimen, from the image of the specimen processed by the image processor, an input/output unit that includes a display screen, and inputs or outputs information to be processed by the image processor and dimensional information extractor or information processed thereby, and a control unit that controls the microscope, imaging recipe composer, image processor, dimensional information extractor, and input/output unit. Herein, the imaging recipe composer has a function of dividing a high-magnification image acquisition area, which is designated using information on the high-magnification image acquisition area designated on the screen of the input/output unit on which a low-magnification image of the specimen picked up by the scanning electron microscope, into plural areas so that adjoining areas overlap while containing part of an edge of the pattern. The control unit has a function of controlling the scanning electron microscope so as to allow the scanning electron microscope to image the divided areas at a high magnification on the basis of the imaging recipe composed by the imaging recipe composer. The image processor has a function of producing a high-magnification panoramic image that has the high-magnification images of the areas, which are picked up by the scanning electron microscope, joined using pieces of edge information on the patterns existent in overlap areas among the images. The dimensional information extractor has a function of extracting a dimension of a pattern from the high-magnification panoramic image produced by the image processor.

Further, according to an embodiment of the present invention, in a pattern dimension measuring method using a scanning electron microscope device, a scanning electron microscope is used to image a specimen, which has patterns formed on the surface thereof, at a low magnification. A low-magnification image of the specimen is displayed on a screen. A high-magnification image acquisition area designated using information on the high-magnification image acquisition area designated on the screen on which the low-magnification image is displayed is divided into plural areas so that adjoining areas overlap while containing parts of the edges of the patterns. An imaging recipe for imaging is composed. Based on the composed imaging recipe, the divided areas are imaged by the scanning electron microscope in order to acquire high-magnification images of the areas. Using pieces of edge information on the patterns existent in the overlap areas among the images, the picked up high-magnification images of the divided areas are joined to produce a high-magnification panoramic image. Dimensional information on a pattern is extracted from the produced high-magnification panoramic image.

In addition, the present invention has features, which are described below, in terms of production of a high-magnification panoramic image.

(1) An inputted wide imaging area (EP) is divided into local imaging areas (SEP) capable of being imaged at an appropriate imaging magnification of an SEM. The SEPs have to be determined to fill up the EP. Herein, what is referred to as the appropriate imaging magnification is a magnification that offers an image resolution which satisfies user-requested pattern shape precision. The determined SEPs are imaged using the SEM. The group of SEP images is joined through image processing, whereby a wide-area panoramic image can be produced.

In order to produce a high-precision panoramic image, an SEP arrangement allowing all SEPs to be joined has to be determined. Whether two adjoining SEPs can be joined or are easy to join is decided depending on whether a pattern that makes it possible or easy to join the SEPs is contained in an overlap area between the two SEPs. However, since semiconductor patterns do not densely exist, an SEP arrangement allowing a pattern serving as a key to joining is contained in all overlap areas may be hard to determine. Noted is a case where even when the pattern is contained only in some of the overlap areas, all the SEPs are joined depending on the combination of the SEPs.

The present invention is characterized in that: index values (hereinafter, called adjacent link information) each indicating whether two arbitrary adjoining SEPs (that share the same overlap area) can be joined or are easy to join is calculated based on patterns contained in the overlap areas between the two SEPs; and an index value (hereinafter, called arbitrary link information) indicating whether two arbitrary SEPs can be joined or are easy to join is calculated based on the adjacent link information. In addition, the arbitrary link information is used as an evaluation value to determine an SEP arrangement. Since the arbitrary link information is used as the evaluation value to determine the SEP arrangement, the number of cases where the SEP arrangement in which all SEPs are joined, though a pattern is not contained in all overlap areas is increased. This is advantageous for coarse patterns that make it hard to contain the pattern in all the overlap areas. In addition, the present invention is characterized in that: the adjacent link information and arbitrary link information are automatically calculated within a computer using inputted design information on circuit patterns or mask patterns as an input; and the SEPs are automatically determined based on the automatically calculated adjacent link information or arbitrary link information. Using the design information, it becomes unnecessary to image a mask or wafer using an SEM only for the purpose of determining the SEPs (SEP determination is made online).

The present invention is characterized in that in addition to determination of an SEP arrangement, an imaging magnification (field of view) for SEPs can be determined simultaneously. As the imaging magnification for SEPs, an arbitrary value may be designated (in this case, the imaging magnification is fixed) or a setting range for the imaging magnification may be designated (for example, Pmin to Pmax. In this case, the imaging magnification is determined in the range from Pmin to Pmax.).

(2) In SEP determination of the above item (1), an SEP arrangement satisfying all user requests may not exist in principle. For example, for determining SEPs in line with a designated imaging magnification, it becomes hard to join all SEPs. In contrast, for making it possible to join all SEPs, the imaging magnification for SEPs cannot help being smaller than the designated value.

Accordingly, the present invention is characterized in that even in such a case, in order to determine an SEP arrangement, which satisfies the user requests as many as possible, as a quasi-optimal solution, plural candidates for the SEP arrangement (hereinafter, called SEP candidates) which are different from one another in imaging positions of SEPs or an imaging magnification therefor are calculated. As a means for determining an appropriate quasi-optimal solution from the candidates, the candidates are displayed in a GUI, and adjacent link information or arbitrary link information is displayed as a criterion. At the time of selecting SEPs, information serving as a key to determination of an SEP arrangement or serving as a key to selection of an SEP candidate is presented to a user. Therefore, the user can easily decide whether each of SEP candidates satisfies user's request items, and can select an appropriate SEP candidate.

(3) The present invention is characterized in that the arbitrary link information includes a result of having grouped all SEPs into sets of mutually joinable SEPs or a result of having grouped them into SEP sets each of which includes SEPs whose easiness of joining are on a level with one another. Since such information is included in the arbitrary link information, the information can be, as mentioned in the above items (1) and (2), displayed in a GUI as an evaluation value for automatic determination of SEPs.

(4) The present invention is characterized in that the arbitrary link information or adjacent link information includes positional deviation volumes estimated when SEPs are actually joined, or includes values calculated based on the positional deviation volumes. In addition, the positional deviation volumes are calculated based on positional deviation volumes detected when pseudo SEM images of the SEPs estimated using design information are actually joined.

(5) The present invention is characterized in that a user-designated pattern is recognized as an inhibition area (of an overlap area), and an SEP arrangement is determined lest the inhibition area should be contained in any of overlap areas among SEPs or in the vicinity of any of the overlap areas. The user-designated pattern includes a complex OPC pattern or any other pattern that should especially be inspected for optimization of a shape. When such a pattern is not contained in an overlap area (a seam between SEPs) or in the vicinity of the overlap area, a shape error in a panoramic image deriving from an error in joining SEPs, or an adverse effect of an image distortion that may occur in the perimeter of an image can be avoided. In addition, the inhibition area may be, as mentioned above, designated by a user, or may be automatically designated based on an index value obtained by evaluating complexity of a shape of a pattern on the basis of design information, or a risky spot at which a device malfunction is likely to occur and which is outputted from an EDA tool or the like.

The present invention is characterized in that the inhibition area is, similarly to the adjacent link information or arbitrary link information, used as an index value for determining an SEP arrangement or an imaging magnification. Therefore, the SEP arrangement or imaging magnification that does not preferably allow the inhibition area to be contained in an overlap area can be determined. In addition, similarly to the adjacent link information or arbitrary link information, the inhibition area is displayed together with the SEP arrangement in a GUI. Therefore, a user can easily decide whether a pattern to be noted (for example, an OPC pattern) is contained in the inhibition area.

(6) For joining determined pickup images of determined SEPs through image processing, it is necessary to align the SEPs so that a degree of overlap (correlation value) for a pattern contained in an overlap area between SEPs gets higher. However, since plural overlap areas exist, all of the correlation values for the overlap areas cannot be maximized (when the correlation value for a certain overlap area is maximized, the correlation values in the other overlap areas may decrease). Therefore, when the pickup images of the SEPs are joined through image processing, a degree to which the correlation value for each overlap area is taken into account is set as a weight on the basis of information on whether SEPs can be joined or are easy to join which is included in the adjacent link information or arbitrary link information.

Joining tends to be achieved so that a correlation value for an overlap area for which a large weight is set becomes as high as possible. For example, a correlation value in an overlap area, in which joining is hard to do, or an overlap area in which a pattern serving as a key to joining is not at all contained is calculated based on an image noise alone. Therefore, there is a risk that joining of SEPs causing the correlation value, which is calculated based on the image noise, to get higher may bring about a large positional deviation. Owing to the aforesaid designation of a weight for each overlap area, the weight for the overlap area in which such a pattern is not contained at all is set to a small value. Eventually, erroneous SEP joining can be minimized.

(7) The present invention is characterized in that as an extraction method for wide-range and high-resolution pattern outlines, two methods to be described below are available.

A wide-range panoramic image having a group of SEP images, which are obtained by imaging plural SEPs with an SEM, joined through image processing is obtained in order to extract wide-range pattern outlines from the panoramic image.

A group of SEP images is obtained by imaging plural SEPs with an SEM, a group of pattern outlines is obtained by extracting pattern outlines from each of the group of SEP images, and the group of pattern outlines is joined in order to obtain wide-range pattern outlines.

Advantageous Effects of Invention

According to an embodiment of the present invention, even when patterns are coarse, an SEP arrangement or SEP imaging magnification allowing all SEPs to be joined can be determined. Even when the SEP arrangement allowing all SEPs to be joined cannot be determined, SEPs that satisfy user's request items as many as possible can be easily determined. By joining pickup images of the obtained SEPs, a wide-range and high-resolution panoramic image (or wide-range and high-resolution pattern outlines) can be acquired. Eventually, pattern information can be acquired from a high-magnification image of a wide field of view that is produced by joining plural high-magnification SEM image pickup areas and that cannot be acquired from a conventional high-magnification SEM image.

In addition, according to an embodiment of the present invention, shape information on a relatively wide area of patterns formed on a mask, which is necessary to perform simulation with an optical proximity effect added, can be acquired from a panoramic image obtained by observing the mask. High-precision simulation prediction of pattern shapes to be transferred to a wafer can be achieved using the pattern shapes as an input. In addition, by comparing the pattern shapes formed on the mask with design information on the mask, calculation of a fabrication error or feedback to conditions for fabrication can be achieved.

In addition, pattern shapes formed on a wafer can be obtained from a panoramic image obtained by observing the wafer. By comparing the pattern shapes with design information, calculation of a mask transfer error or feedback to fabrication parameters such as conditions for exposure to can be achieved. Further, change of mask patterns or the like is carried out in order to cope with a shape error that cannot be fully compensated by modifying the fabrication parameters. Thus, a high yield can be attained.

These and other objects, features, and advantages of the invention will be apparent from the following more particular description of preferred embodiments of the invention, as illustrated in the accompanying drawings.

DESCRIPTION OF EMBODIMENTS

The present invention is an invention relating to a device that produces a wide-range image of high joining precision, that is, a panoramic image using plural SEM images of a relatively high magnification which are obtained by imaging adjoining areas on a specimen using a scanning electron microscope, and obtaining a dimension of a pattern on the specimen or shape information thereon using the produced synthetic image, and a method to be implemented in the device. Hereinafter, a description will be made of a case where an embodiment of the present invention is adapted to the scanning electron microscope (SEM).

1. SEM

Figure 1:
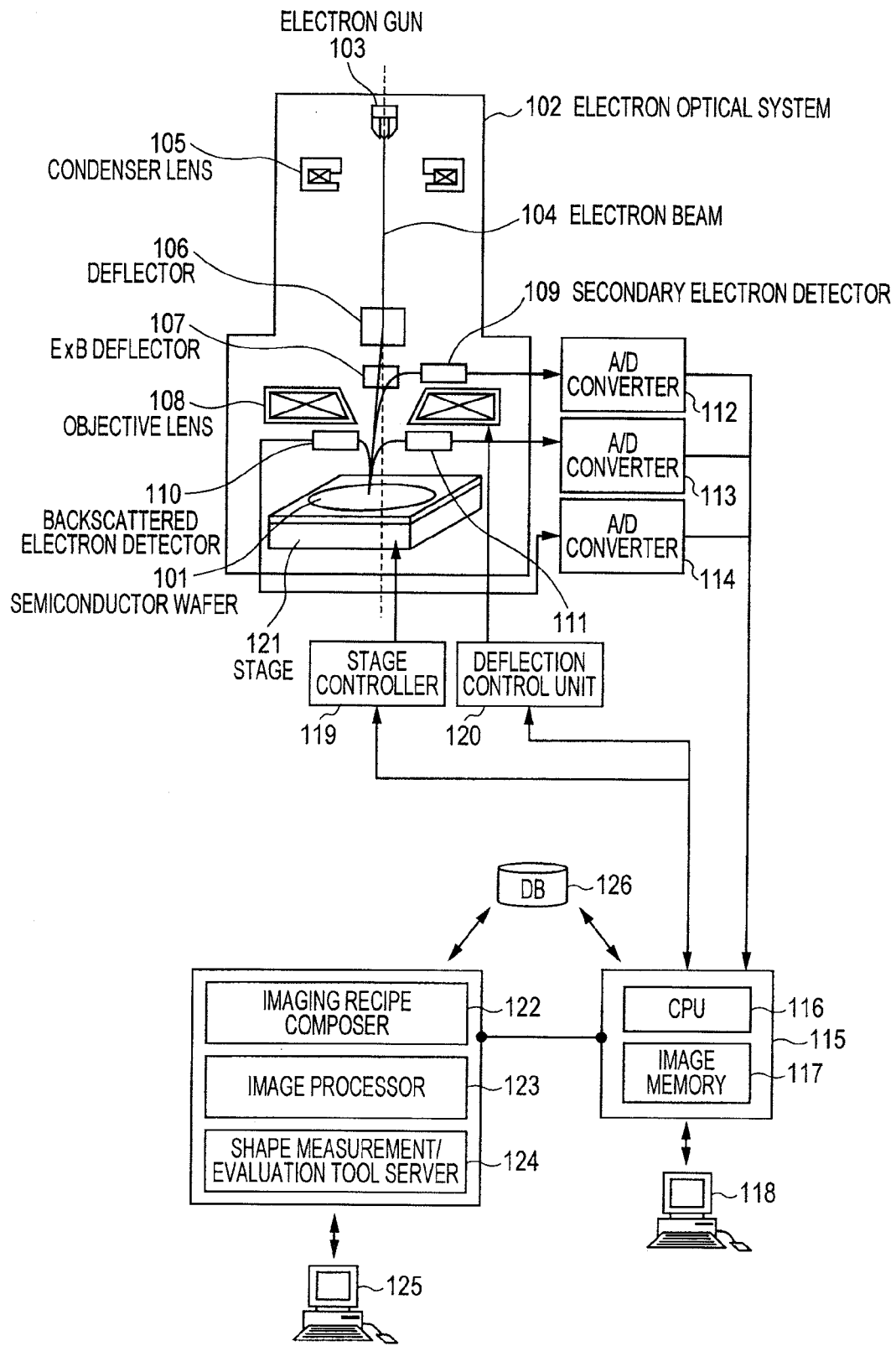
FIG. 1 is a block diagram showing a schematic configuration of an SEM device.

FIG. 1 is a block diagram schematically showing the configuration of an SEM that acquires a secondary electron (SE) image of a specimen or a backscattered electron (BSE) image thereof. The SE image and BSE image shall be generically called SEM images. An image to be acquired herein includes part or the whole of a top-down image obtained by irradiating an electron beam to an object of measurement in a perpendicular direction. An electron optical system 102 internally includes an electron gun 103 so as to generate an electron beam 104. The electron beam emitted from the electron gun 103 is narrowed by a condenser lens 105. Thereafter, the position of irradiation of the electron beam and an aperture value therefor are controlled by a deflector 106 and an objective lens 108 so that the electron beam is focused on and irradiated to an arbitrary position on a semiconductor wafer 101 that is a specimen placed on a stage 121. From the semiconductor wafer 101 to which the electron beam is irradiated, secondary electrons and backscattered electrons are emanated. The secondary electrons separated from the trajectory of the irradiated electron beam by an E×B deflector 107 are detected by a secondary electron detector 109. In contrast, the backscattered electrons are detected by backscattered electron detectors 110 and 111. The backscattered electron detectors 110 and 111 are disposed in mutually different directions. The secondary electrons and backscattered electrons detected by the secondary electron detector 109 and the backscattered electron detectors 110 and 111 are converted into digital signals by analog-to-digital converters 112, 113, and 114, inputted to a processing/control unit 115, stored in an image memory 117, and subjected to image processing dependent on a purpose by a CPU 116.

Figure 2A:
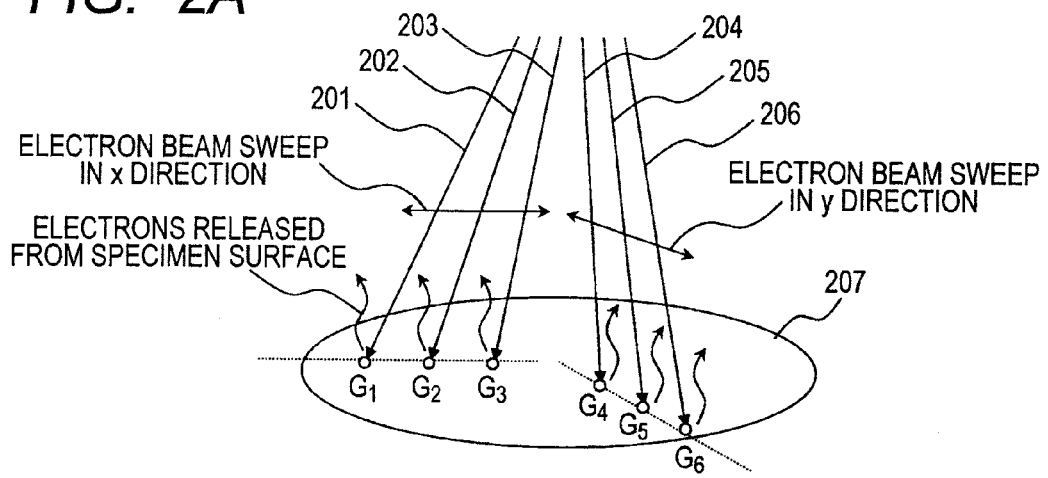
FIG. 2A is a diagram showing sweep of an electron beam in x and y directions over a semiconductor wafer.
Figure 2B:
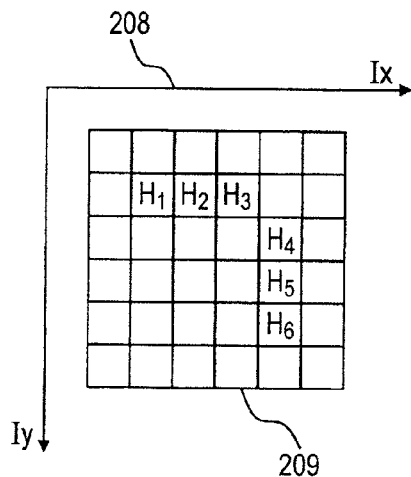
FIG. 2B is a diagram showing a method of imaging signal levels of electrons released from the semiconductor wafer.

FIG. 2A shows a method of scanning or irradiating an electron beam over or to a semiconductor wafer, and visualizing signal levels of electrons released from the semiconductor wafer. The electron beam is, for example, as shown in FIG. 2A, scanned and irradiated in x and y directions as indicated by reference numerals 201 to 203 or 204 to 206. By changing the direction of deflection of the electron beam, a scanning direction can be altered. Reference numerals G1 to G3 denote places on the semiconductor wafer to which the electron beams 201 to 203 scanned in the x direction are irradiated. Likewise, reference numerals G4 to G6 denote places on the semiconductor wafer to which the electron beams 204 to 206 scanned in the y direction are irradiated. Signal levels of electrons released from the positions G1 to G6 provide lightness values of pixels H1 to H6 in an image 209 shown in FIG. 2B (subscripts 1 to 6 accompanying G and those accompanying H are associated with each other). Reference numeral 208 denotes a coordinate system defining x and y directions in an image. By scanning the inside of a field of view with an electron beam, an image frame 209 can be obtained. In reality, the inside of the field of view is scanned with the electron beam several times in the same manner, and obtained image frames are averaged in order to obtain a high signal-to-noise ratio image. The number of frames to be added up can be set arbitrarily.

In FIG. 1, the processing/control unit 115 is a computer system including the CPU 116 and image memory 117, transmits a control signal to a stage controller 119 or a deflection control unit 120 so as to image imaging points on the basis of an imaging recipe, or performs various pieces of imaging processing on a pickup image of an arbitrary imaging point on the semiconductor wafer 101, that is, processes or controls the pickup image. Herein, what is referred to as the imaging point encompasses some or all of an addressing point (hereinafter, AP), autofocus point (hereinafter, AF), auto-stigma point (hereinafter, AST), auto-brightness/contrast point (hereinafter, ABCC), and evaluation point (hereinafter, EP). In addition, the processing/control unit 115 is connected to a processing terminal 118 (including an input/output unit such as a display, keyboard, mouse, and others), and includes a graphical user interface (GUI) through which an image or the like is presented to a user or an input is received from the user. Reference numeral 121 denotes an XY stage that moves the semiconductor wafer 101 and makes it possible to pick up an image of an arbitrary position on the semiconductor wafer. Shifting an imaging position by means of the XY stage 121 is referred to as stage shift, and shifting an observing position by deflecting an electron beam by means of, for example, the deflector 106 is referred to as image shift. In general, the stage shift has the property of being wide in a movable range but low in positioning precision for the imaging position. In contrast, the image shift has the property of being narrow in the movable range but high in the positioning precision for the imaging position.

FIG. 1 shows an embodiment including two detectors for a backscattered electron image. Alternatively, the backscattered electron image detectors may be excluded and the number of backscattered electron image detectors may be decreased or increased.

In an imaging recipe composer 122, an imaging recipe for determining SEPs and imaging the SEPs is composed according to a method to be described later. Based on the recipe, the SEM device is controlled in order to pick up images. In the imaging recipe, pieces of information on sizes and coordinates of SEPs, imaging conditions therefor, an imaging sequence for imaging the SEPs (including coordinates of imaging points and an imaging order, or more broadly, including sizes of the imaging points, imaging conditions, and an adjustment method), and registration templates such as an AP, AF, AST, and ABCC are written.

In addition, in an image processor 123, panoramic image construction processing using plural picked up SEP images, outline extraction processing for extracting circuit patterns from the panoramic image, and others are carried out. In a shape measurement/evaluation tool server 124, shape measurement or shape evaluation using the panoramic image and outlines is carried out. The imaging recipe composer 122, image processor 123, and shape measurement/evaluation tool server 124 are connected to a processing terminal 125 (including an input/output unit such as a display, keyboard, mouse, and others), and includes a graphical user interface (GUI) through which a result of processing or the like is presented to a user or an input is received from the user. Reference numeral 126 denotes a storage in which a database containing design/layout information on semiconductor circuit patterns (hereinafter, design information) is saved. In the database, pieces of information such as picked up SEP images, a produced panoramic image, outlines, a result of shape measurement or evaluation, and an imaging recipe can be preserved or used in common. Pieces of processing to be performed in the components 116, 122, 123, and 124 may be combined arbitrarily, assigned to plural components, or integrally processed by one component.

2. Panoramic Image Construction Processing

Panoramic image construction processing for constructing a wide-area image to be performed by the image processor 123 is processing of dividing an inputted wide-area imaging area (EP) into local imaging areas (SEPs) that can be imaged at a relatively high imaging magnification of an SEM, imaging the SEPs at the relatively high magnification of the SEM, joining the group of high-magnification SEP images through image processing, and thus producing a wide-range and high-magnification (high-resolution) SEM image (panoramic image).

In order to obtain a high-precision panoramic image, an imaging position for SEPs (SEP arrangement) and an imaging magnification for the SEPs which make all SEM images joinable have to be determined. The present invention relates to determination of SEPs, which makes all the SEPs joinable, and joining of SEP images. Examples relating to SEP determination in accordance with the present invention will be described below.

In panoramic image construction processing, an inputted wide imaging area (EP) is divided into local imaging areas (SEPs) that can be imaged at an appropriate imaging magnification of an SEM. The SEPs have to be determined to fill up the EP. Herein, what is referred to as the appropriate imaging magnification is a magnification that provides an image resolution which meets a user-requested pattern shape precision. The determined SEPs are imaged by the SEM, and the group of SEP images is joined through image processing in order to produce a wide-area panoramic image.

For producing a high-precision panoramic image, it is necessary to determine an SEP arrangement that allows all SEPs to be joined. Next, an evaluation method for whether SEPs can be joined or are easy to join will be described below.

2.1 Adjacent Link Information

Whether two adjoining SEPs can be joined or are easy to join can be decided based on whether a pattern that makes the SEPs joinable or easy to join is contained in an overlap area between the two SEPs. Index values each indicating on the basis of a pattern contained in an overlap area between two SEPs whether the two arbitrary adjoining SEPs (sharing the same overlap area) can be joined or are easy to join shall be referred to as adjacent link information. More particularly, the adjacent link information can be calculated based on design information on inputted circuit patterns or mask patterns.

An example of calculation of adjacent link information will be described in conjunction with FIG. 3A to FIG. 3C. Reference numeral 301 in FIG. 3A denotes a result of having divided an inputted EP (302) into four SEPs (303-1 to 303-4) according to inputted design patterns. If an overlap area between SEPs fully contains a pattern that varies in an x direction, a deviation in the x direction can be detected. This enables alignment in the x direction (for example, SEPs 303-2 and 303-4). Likewise, if the overlap area fully contains a pattern that varies in a y direction, alignment in the y direction is enabled (for example, SEPs 303-1 and 303-2). Therefore, if the overlap area fully contains a pattern that varies in the x and y directions, the two adjoining SEPs can be joined (for example, SEPs 303-3 and 303-4).

Figure 3A:
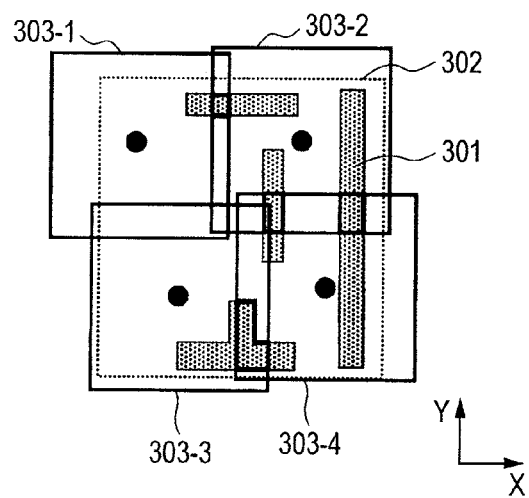
FIG. 3A is an enlarged diagram of specimen patterns showing a state in which an inputted EP is divided into four SEPs.
Figure 3B:
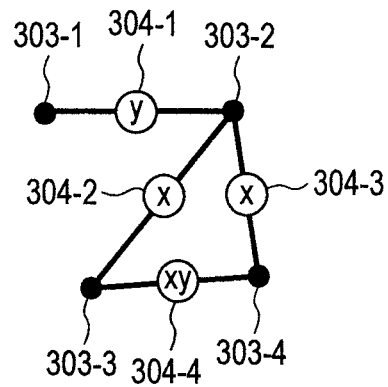
FIG. 3B is a diagram showing a result of having evaluated whether adjoining SEPs out of the four SEPs can be joined.

FIG. 3B shows a result of having evaluated whether adjoining SEPs in the SEP arrangement shown in FIG. 3A can be joined. In the drawing, SEPs that can be aligned in the x direction alone are linked with a black line and expressed with a symbol having x enclosed in a circle (304-2, 304-3). SEPs that can be aligned in the y direction alone are linked with the black line and expressed with a symbol having y enclosed in a circle (304-1). SEPs that can be aligned in both the x and y directions are linked with the black line and expressed with a symbol having xy enclosed in a circle (304-4). SEPs that contain no pattern in an overlap area thereof are not expressed at all. Further, a segment length in each of the x and y directions of a pattern contained in the overlap area may be regarded as an index value indicating an ease of joining, or the index value may be calculated based on the segment length.

Figure 3C:
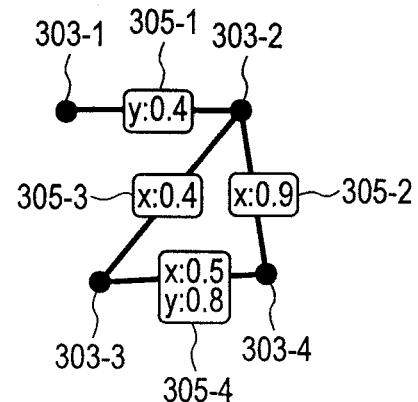
FIG. 3C is a diagram showing a result of having evaluated whether adjoining SEPs out of the four SEPs can be joined and a result of having evaluated based on a segment length of a pattern in an overlap area whether the adjoining SEPs are easy to join.

FIG. 3C shows a result of having calculated easiness of joining on the basis of segment lengths of patterns in respective overlap areas (305-1 to 305-4). In the drawing, an ease of joining in the x direction is expressed as x: numerical value, and an ease of joining in the y direction is expressed as y: numerical value. The higher the numerical value is, the easier the joining is.

Figure 4A:
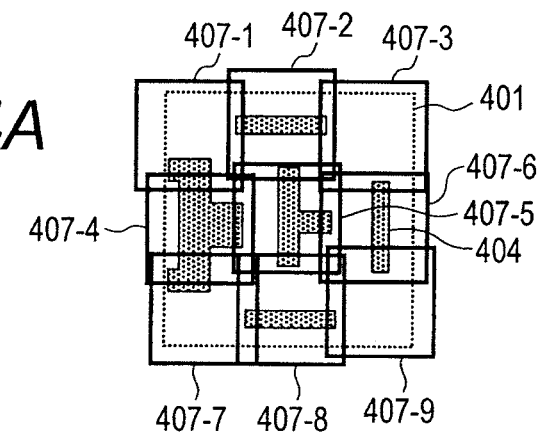
FIG. 4A is a diagram showing an example in which all SEPs can be joined because a pattern serving as a key to joining is contained in each of overlap areas among all the SEPs.
Figure 4B:
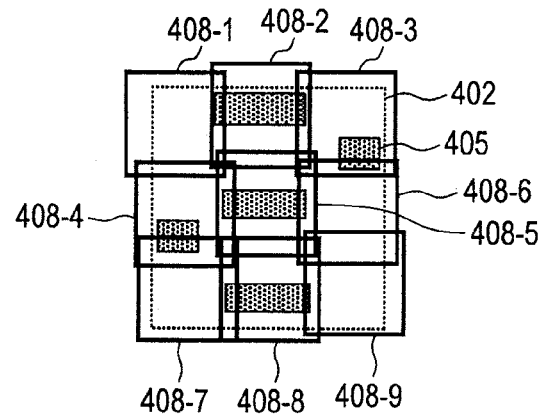
FIG. 4B is a diagram showing an example in which all SEPs are joined, though a pattern serving as a key to joining is not contained in overlap areas among part of the SEPs, and an example in which all SEPs are not joined because a pattern serving as a key to joining is not contained in overlap areas among part of the SEPs.
Figure 4C:
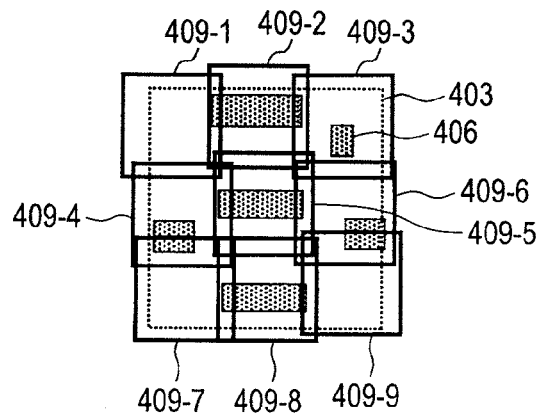
FIG. 4C is a diagram showing an example in which all SEPs are not joined because a pattern serving as a key to joining is not contained in overlap areas among part of the SEPs.

Next, a description will be made of an evaluation method for whether all SEPs can be joined or are easy to join. To begin with, conditions under which all the SEPs can be joined will be described in conjunction with FIGS. 4A to 4C. FIG. 4A to FIG. 4C show examples in which an inputted EP (401, 402, 403) and design information (404, 405, 406) are divided into SEPs (407-1 to 407-9, 408-1 to 408-9, 409-1 to 409-9).

FIG. 4A shows an SEP arrangement in which a pattern serving as a key to joining is contained in each of overlap areas among all SEPs. In this case, all the SEPs can be joined. However, since semiconductor patterns do not densely exist, the SEP arrangement having the pattern serving as a key to joining contained in all the overlap areas may be hard to determine. Noted in contrast is that even if the pattern is not contained in some of the overlap areas, all the SEPs may be able to be joined depending on the combination thereof.

As for, for example, the SEP arrangement in FIG. 4B, although a pattern is not contained in all overlap areas, when SEPs are joined in the order of SEPs 408-1, 408-2, 408-3, 408-6, 408-5, 408-4, 408-7, 408-8, and 408-9, all the SEPs can be joined. In contrast, like FIG. 4C, there is a case where since a pattern is not contained in all overlap areas, all SEPs cannot be joined.

Specifically, in FIG. 4C, SEPs 409-1, 409-2, and 409-3 can be joined, but the other SEPs (409-4 to 409-9) cannot be joined. In the case where a pattern is not contained in all overlap areas, there are cases where all SEPs are joined and are not joined. In order to accurately discriminate the cases from each other, it is necessary to decide whether all SEPs can be joined. In order to make all SEPs joinable, two arbitrary SEPs should be able to be joined.

2.2 Adjacent Link Information

Accordingly, the present invention is characterized in that an index value signifying whether two arbitrary SEPs can be joined or are easy to join (hereinafter, arbitrary link information) is calculated based on adjacent link information. FIG. 5A to FIG. 5E concretely show examples in which adjacent link information is used to calculate arbitrary link information.

Figure 5A:
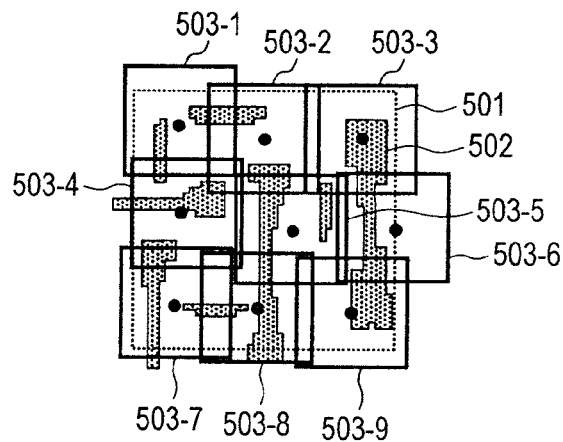
FIG. 5A is a diagram showing an example in which an EP is divided into nine SEPs on the basis of the inputted EP and design information.
Figure 5B:
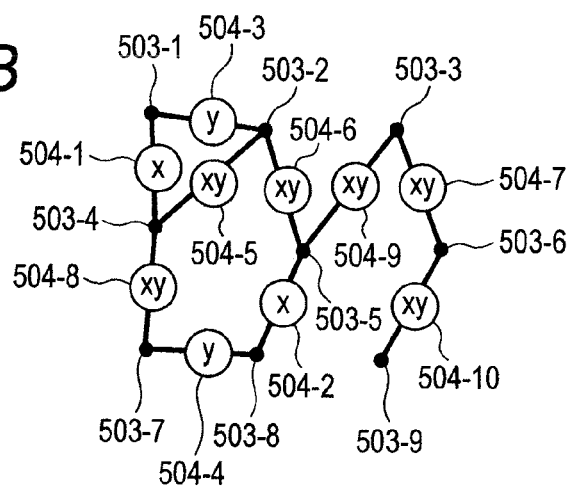
FIG. 5B is a diagram showing an example in which adjacent link information among SEPs is calculated.

FIG. 5A shows a result of having divided an inputted EP (501) and design information (502) into nine SEPs (503-1 to 503-9). FIG. 5B shows adjacent link information for the SEP arrangement shown in FIG. 5A. In the drawing, a black dot is corresponding to a center position of the SEP in FIG. 5A. If adjoining SEPs can be aligned in the x direction, black dots are linked with a solid line and the solid line is appended a symbol having x enclosed in a circle (504-1, 504-2). Likewise, if adjoining SEPs can be aligned in the y direction, a solid line is appended a symbol having y enclosed in a circle (504-3, 504-4). If adjoining SEPs can be aligned in the x and y directions, a solid line is appended a symbol having xy enclosed in a circle (504-5 to 504-10).

Figure 5C:
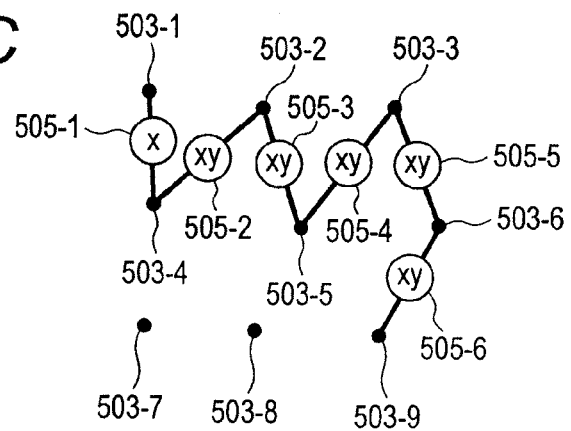
FIG. 5C is a diagram showing an example in which adjacent link information in an x direction is extracted.
Figure 5D:
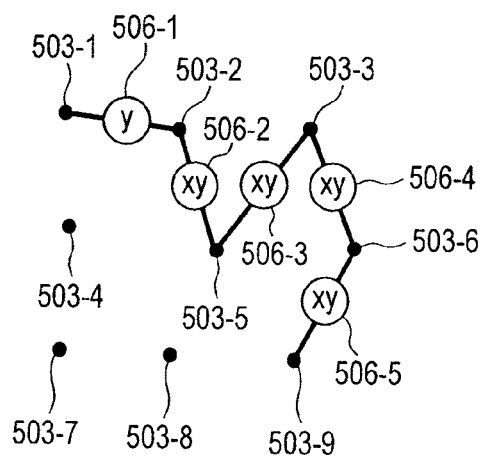
FIG. 5D is a diagram showing an example in which adjacent link information in a y direction is extracted.
Figure 5E:
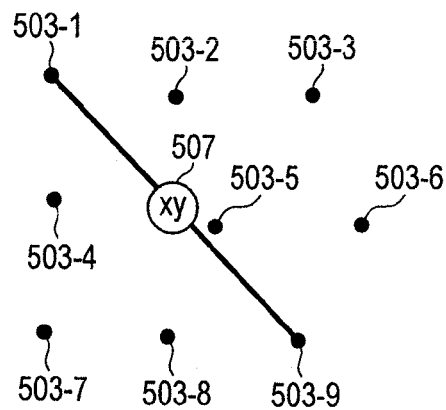
FIG. 5E is a diagram showing that SEPs 503-1 and 503-9 can be joined.

Based on the adjacent link information shown in FIG. 5B, whether two arbitrary SEPs can be joined in each of the x and y directions can be decided. Deciding whether, for example, SEPs 503-1 and 503-9 can be joined will be described in conjunction with FIG. 5C and FIG. 5D. In FIG. 5C and FIG. 5D, adjacent link information existent between the SEP 503-1 and SEP 503-9 is extracted from FIG. 5B in relation to each of the x and y directions. In FIG. 5C, the SEPs 503-1 and 503-9 can be aligned in the x direction by way of links 505-1 to 505-6. In FIG. 5D, the SEPs 503-1 and 503-9 can be aligned in the y direction by way of links 506-1 to 506-5. Therefore, the SEPs 503-1 and 503-9 can be joined. The same decision is made on all combinations of two SEPs. If all the SEPs can be aligned in the x and y directions, all the SEPs can be joined.

In addition, the present invention is characterized in that arbitrary link information is regarded as an evaluation value in order to determine an SEP arrangement. When the arbitrary link information is regarded as the evaluation value in order to determine the SEP arrangement, the number of cases where an SEP arrangement that allows all SEPs to be joined, though a pattern is not contained in all overlap areas can be determined increases. This is advantageous to coarse patterns that make it hard to contain a pattern in all overlap areas.

Figure 6A:
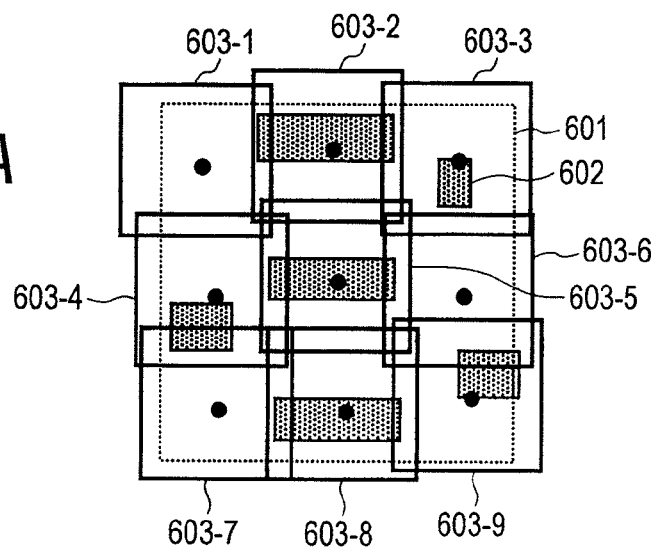
FIG. 6A is a diagram showing an example in which an EP is divided into nine SEPs on the basis of the inputted EP and design information.
Figure 6B:
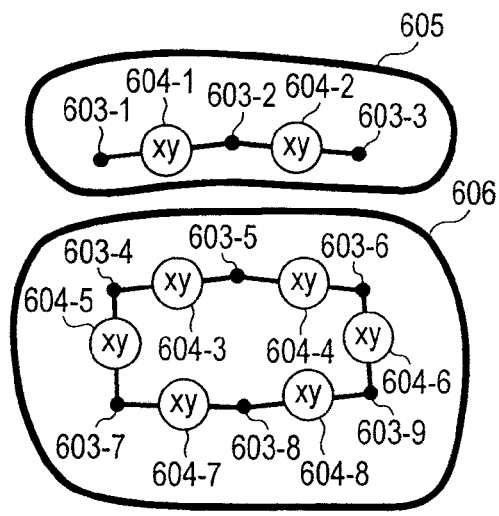
FIG. 6B is a diagram showing a state in which all SEPs are grouped into two joinable SEP sets on the basis of adjacent link information among SEPs.
Figure 6C:
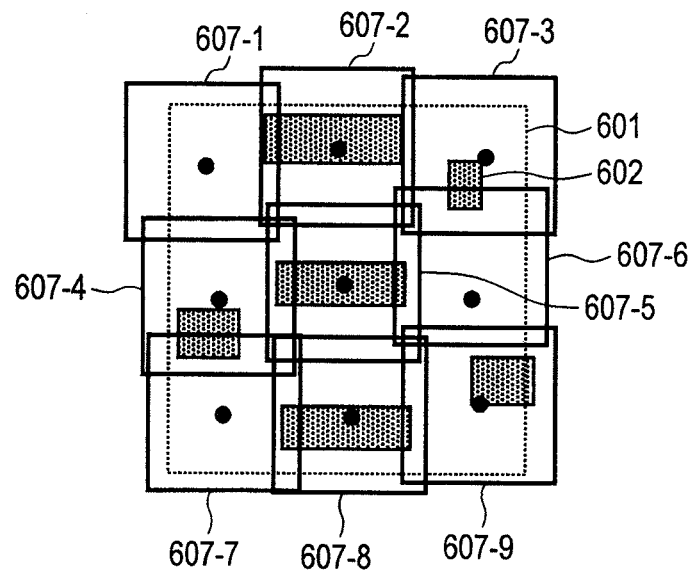
FIG. 6C is a diagram showing a result of having updated imaging positions of SEPs so that the separated joinable sets can be joined.
Figure 6D:
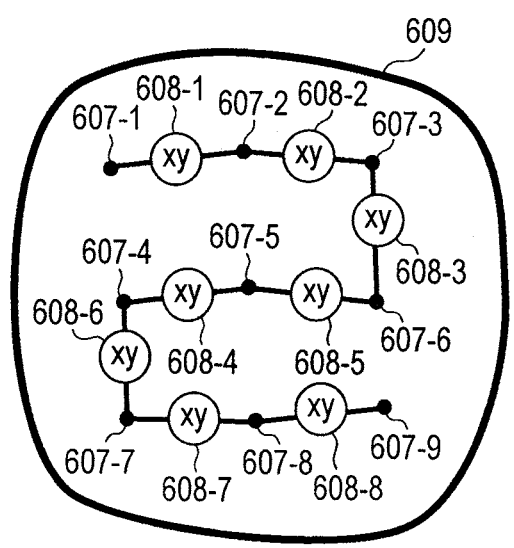
FIG. 6D is a diagram showing adjacent link information among SEPs obtained as a result of having updated the imaging positions of SEPs and grouped the SEPs into one SEP set.

FIG. 6A to FIG. 6D show examples in which it is hard to contain a pattern in overlap areas among all SEPs. However, using the aforesaid arbitrary link information, an SEP arrangement allowing all SEPs to be joined can be determined. As shown in FIG. 6A, an inputted EP (601) and design information (602) are divided into SEPs 603-1 to 603-9, and adjacent link information is, as shown in FIG. 6B, denoted by reference numerals 604-1 to 604-8. SEP sets that are joinable in both the x and y directions are each encircled with a bold-line frame (605 and 606). In FIG. 6B, all the SEPs are grouped into the two joinable SEP sets, but all the SEPs cannot be joined. FIG. 6C and FIG. 6D show a result of having updated an imaging position for each of the SEPs so that the separated joinable sets can be joined. Reference numerals 607-1 to 607-9 in FIG. 6C denote an updated SEP arrangement, and reference numerals 608-1 to 608-8 in FIG. 6D denote adjacent link information on the SEP arrangement. In this case, the separated SEP sets 605 and 606 are joined by a link 608-3. Thus, when SEPs are determined using arbitrary link information as an index value, even if a pattern is not contained in all overlap areas, an SEP arrangement allowing all SEPs to be joined can be determined. In addition, adjacent link information and arbitrary link information are automatically calculated in a computer using design information on inputted circuit patterns or mask patterns as an input. Based on the automatically calculated adjacent link information or arbitrary link information, SEPs are automatically determined. Using the design information, it becomes unnecessary to image a mask or wafer using an SEM for the sole purpose of determining SEPs (SEP determination is made offline).

2.3 Determining an SEP Imaging Magnification

The present invention is characterized in that, in addition to the foregoing determination of an SEP arrangement, an imaging magnification (field of view) for SEPs can be determined simultaneously. As for the imaging magnification for SEPs, an arbitrary value may be designated (in this case, the imaging magnification is fixed) or a setting range for the imaging magnification may be designated (for example, a range from Pmin to Pmax. In this case, the imaging magnification is determined within the range from Pmin to Pmax). As a method for determining the imaging magnification for SEPs, for example, a maximum imaging magnification among SEP imaging magnifications, which permit an SEP arrangement that allows all SEPs to be joined, within an inputted settable range for the imaging magnification for SEPs may be automatically set as the imaging magnification for SEPs.

Figure 7A:
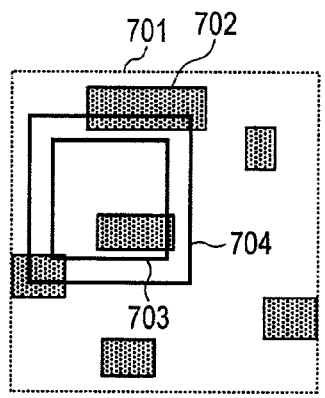
FIG. 7A is a diagram showing an inputted EP and design information by superposing them on each other.
Figure 7B:
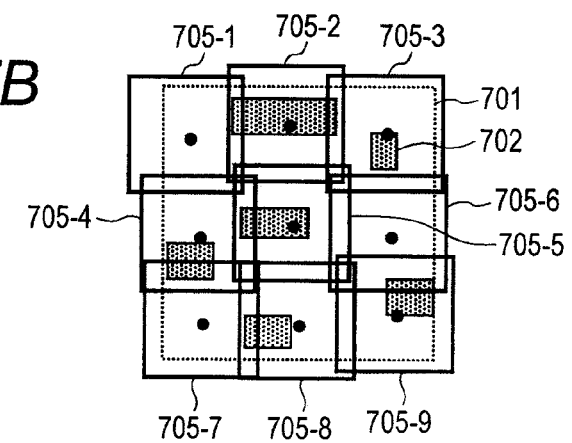
FIG. 7B is a diagram showing an example in which an EP is divided into nine SEPs by setting an SEP imaging magnification to an upper limit of a settable range.

This example will be described in conjunction with FIG. 7A to FIG. 7E. FIG. 7A shows an inputted EP (701) and design information (702). Reference numerals 703 and 704 in the drawing denote SEPs for imaging magnifications equivalent to a lower limit Pmin and upper limit Pmax of a settable range for an SEP imaging magnification. FIG. 7B shows a result of having set the SEP imaging magnification to the upper limit Pmax of the settable range, and divided the EP into nine SEPs (705-1 to 705-9). Reference numerals 706-1 to 706-6 in FIG. 7C denote adjacent link information on the SEP arrangement (705-1 to 705-9), and reference numerals 707 to 709 denote a result of having grouped all SEPs into joinable SEP sets. At the SEP imaging magnification Pmax, all the SEPs cannot be joined.

Figure 7C:
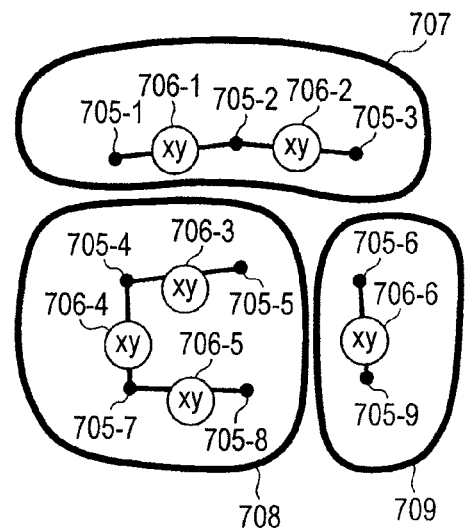
FIG. 7C is a diagram showing a result of having set an imaging magnification to a lower limit of a settable range, and calculated adjacent link information among adjoin SEPs of nine SEPs into which an EP is divided.
Figure 7D:
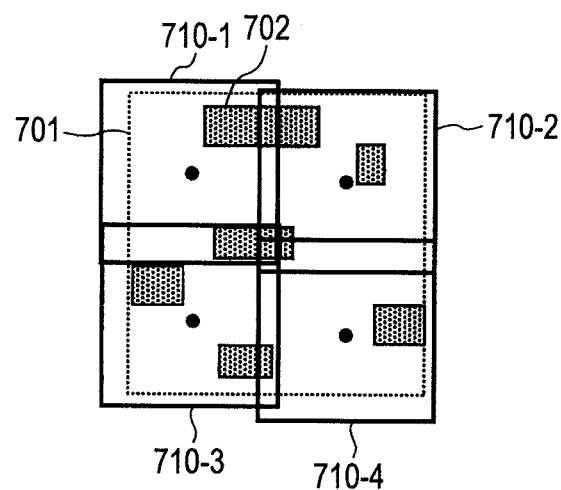
FIG. 7D is a diagram showing an example in which an SEP imaging magnification is set to a lower limit of a settable range and an EP is divided into four SEPs.
Figure 7E:
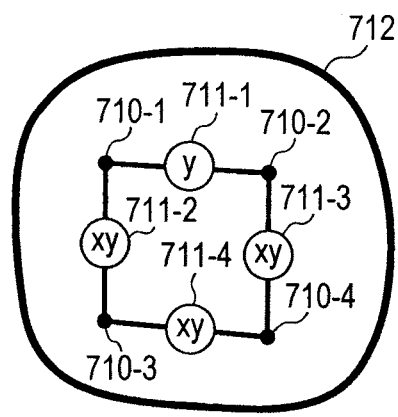
FIG. 7E is a diagram showing a result of having set an imaging magnification to a lower limit of a settable range, and calculated adjacent link information among adjoining ones of four SEPs into which an EP is divided.

In contrast, FIG. 7D shows a result of having set the SEP imaging magnification to the lower limit Pmin of the settable range, and divided the EP into four SEPs (710-1 to 710-4). Reference numerals 711-1 to 711-4 in FIG. 7E denote adjacent link information, and reference numeral 712 denotes a joinable SEP set. At the SEP imaging magnification Pmin, all the SEPs can be joined. Therefore, in this example, when the imaging magnification is automatically determined as the lower limit Pmin, the SEP arrangement allowing all the SEPs to be joined can be determined. For a better understanding, the two imaging magnifications Pmin and Pmax are compared with each other in order to determine the imaging magnification. In practice, whether SEPs can be joined or are easy to join can be evaluated at an arbitrary imaging magnification between the limits Pmin and Pmax, and the arbitrary imaging magnification can be set.

2.4 Variations of Adjacent Link Information and Arbitrary Link Information

Figure 8:
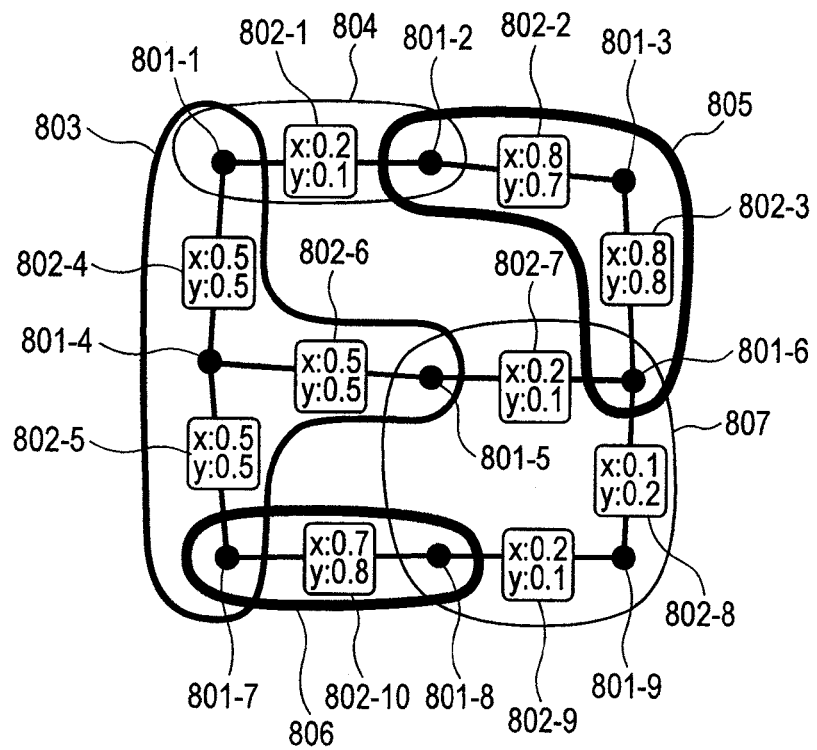
FIG. 8 is a diagram showing an example in which all SEPs are grouped into SET sets easiness of joining of each of which are on a level with one another.

The arbitrary link information encompasses a result of having grouped all SEPs into sets of mutually joinable SEPs (joinable SEP sets) which is described in conjunction with FIG. 7C (equivalent to 707, 708, 709 in FIG. 7C), and a result of having grouped all SEPs into SEP sets each of which includes SEPs whose easiness of joining is on a level with one another (easy-to-join SEP sets). FIG. 8 shows an example in which all SEPs are grouped into easy-to-join SEP sets. In the drawing, reference numerals 801-1 to 801-9 denote an SEP arrangement, and reference numerals 802-1 to 802-10 denote adjacent link information (easiness of joining among adjacent SEPs). Reference numerals 803 to 807 denote grouped easy-to-join sets. What is referred to as the easy-to-join SEP set is a set of SEPs whose easiness of joining are on a level with one another. As for frames for the sets 803 to 807, the thicker the frame is, the easier joining is. The easy-to-join SEP sets 804 and 807 are sets of index values of easiness of joining that are equal to or smaller than 0.2 (the smaller the index value is, the harder joining is). The easy-to-join SEP set 803 is a set of index values of easiness of joining that are larger than 0.2 and equal to or smaller than 0.5. The easy-to-join SEP sets 805 and 806 are sets of index values of easiness of joining that are equal to or larger than 0.5 and equal to or smaller than 0.8. When information on the easy-to-join SEP sets is included in the arbitrary link information, the information can be used as an evaluation value for automatic determination of SEPs. The information on the easy-to-join SEP sets can be displayed through a GUI. An example of the GUI display will be described later.

The aforesaid arbitrary link information or adjacent link information includes positional deviation volumes expected when SEPs are actually joined, or includes values calculated based on the positional deviation volumes. The positional deviation volumes are calculated based on positional deviation volumes detected when pseudo SEM images of SEPs estimated based on design information are actually joined. Herein, the pseudo SEM images shall be images produced by simulating actually obtained SEM images, and adding deformations of patterns, a lag in SEM imaging, or an image noise, which may actually occur, to design information. The pseudo SEM image is produced for all SEPs, and a group of pseudo SEM images is actually joined. Thus, even when SEM images are not actually picked up and joined, a joining error that may actually occur can be estimated.

Figure 9A:
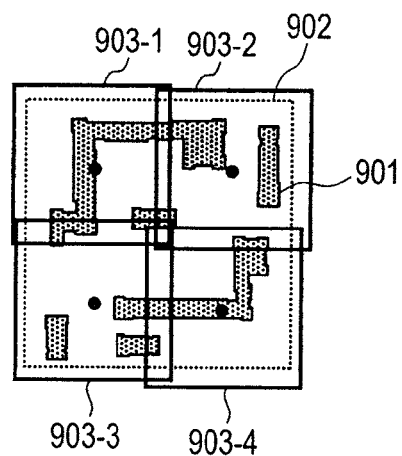
FIG. 9A is a diagram showing a state in which an EP is divided into four SEPs on the basis of inputted EP information and design information.
Figure 9B:
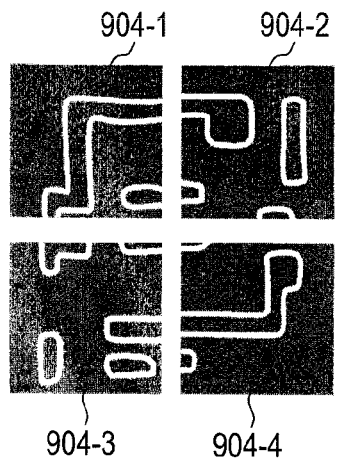
FIG. 9B is a diagram showing pseudo SEM images produced in association with four SEPs.
Figure 9C:
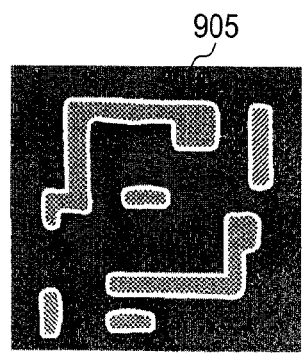
FIG. 9C is a diagram showing a result of having joined four pseudo SEM images.
Figure 9D:
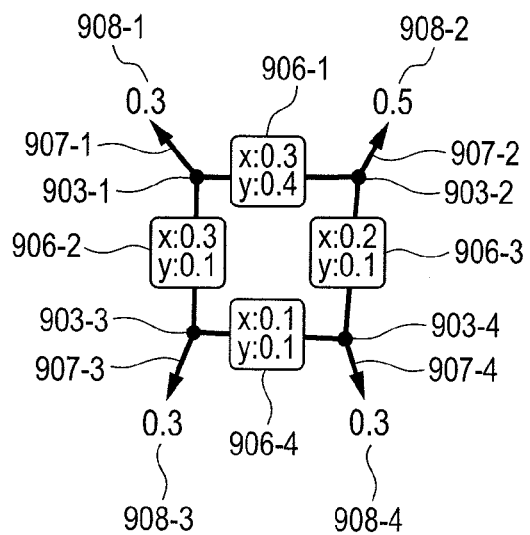
FIG. 9D is a diagram showing a result of having calculated positional deviation volumes among the pseudo SEM images that are joined.

An example in which positional deviation volumes are calculated according to the foregoing method will be described in conjunction with FIG. 9A to FIG. 9D. FIG. 9A shows a result of having divided inputted design information (901) and an inputted EP (902) into four SEPs (903-1 to 903-4). For the SEP arrangement, pseudo SEM images of the respective SEPs are produced (904-1 to 904-4 in FIG. 9B). A result of having joined the group of images is shown as an image 905 in FIG. 9C. Since the positions of the pseudo SEM images 904-1 to 904-4 are apparent from cutting positions in the design information, positional deviation volumes of the respective SEPs in the joined image 905 can be obtained. FIG. 9D shows estimated positional deviation volumes. Reference numerals 906-1 to 906-4 in the drawing denote relative positional deviation volumes among the SEPs estimated in each of the x and y directions. Instead of the relative positional deviation values among the SEPs, absolute positional deviation volumes of the respective SEPs with respect to a certain reference may be calculated. Reference numerals 907-1 to 907-4 in the drawing show the absolute positional deviation volumes of the respective SEPs in the form of vectors. Reference numerals 908-1 to 908-4 denote the magnitudes of the vectors.

2.5 Inhibition Area

Figure 10A:
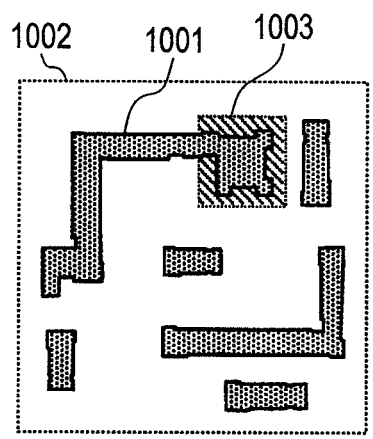
FIG. 10A is a diagram showing inputted EP information and design information, and a user-designated inhibition area.
Figure 10B:
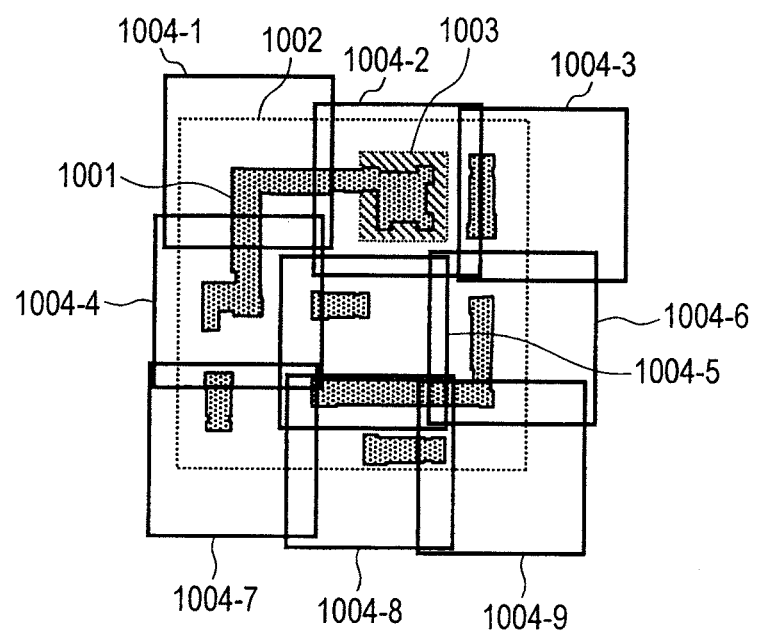
FIG. 10B is a diagram showing an example in which nine SEPs are arranged based on the inputted EP information and design information lest the designated inhibition area should be contained in the vicinity of any of overlap areas among SEPs.
Figure 10C:
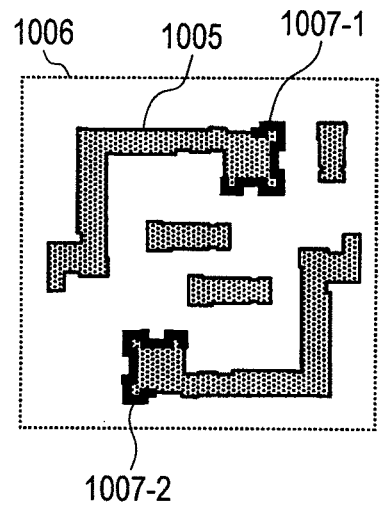
FIG. 10C is a diagram showing an example in which the inhibition area is designated as a set of segments in design information.

The present invention is characterized in that a user-designated pattern is regarded as an "inhibition area (of an overlap area)", and an SEP arrangement is determined lest the inhibition area should be contained in an overlap area between SEPs or in the vicinity of the overlap area. The user-designated pattern encompasses a complex OPC pattern or any other pattern that should especially be inspected in order to optimize a shape. When the pattern is not located in the overlap area (a seam between SEPs) or in the vicinity of the overlap area, a shape error in a panoramic image deriving from an error in joining SEPs, or an adverse effect of an image distortion that may occur in the periphery of an image can be avoided. The inhibition area may be, as mentioned above, designated by a user, or may be automatically designated based on index values, which are obtained by evaluating the complexities of the shapes of patterns according to design information, or a risky point at which a device malfunction is likely to occur and which is outputted from an EDA tool or the like. More particularly, an example in which SEPs are determined by designating and appending the inhibition area will be described in conjunction with FIG. 10A to FIG. 10D. FIG. 10A shows inputted design information (1001), an inputted EP (1002), and an area (1003) that is designated as an inhibition area in the form of a rectangular area (hatched in the drawing) by a user. FIG. 10B shows a result of having determined an SEP arrangement (1004-1 to 1004-9) lest the inhibition area designated in FIG. 10A should be contained in the vicinity of an overlap area between SEPs.

Figure 10D:
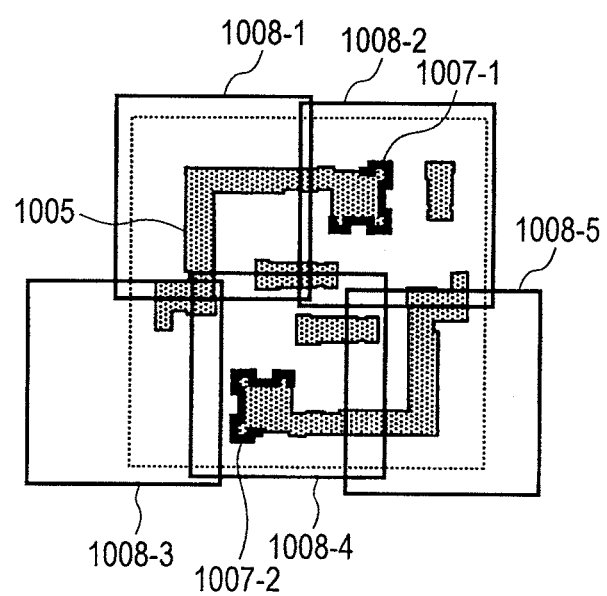
FIG. 10D is a diagram showing an example in which five SEPs are arranged based on the inputted EP information and design information lest the inhibition area designated as the set of segments in the design information should be contained in the vicinity of any of the overlap areas among SEPs.

As an inhibition area designation method, variations are conceivable. Specifically, as shown in FIG. 10A, the inhibition area may be designated in the form of the rectangular area. As denoted by reference numerals 1007-1 and 1007-2 in FIG. 10C, the inhibition area may be designated in the form of a set of segments in design information. FIG. 10D shows a result of having determined an SEP arrangement (1008-1 to 1008-5) lest the inhibition area designated in FIG. 100 should be contained in the vicinity of an overlap area between SEPs. The inhibition areas may be designated by a user. Alternatively, index values (frequencies at each of which a pattern per a unit area varies in the x or y direction) obtained by evaluating the complexities of pattern shapes may be calculated from design information (1005) in an EP (1006), and the inhibition area may be automatically designated based on the index values.

The inhibition area is, similarly to the adjacent link information or arbitrary link information, used as an index value for determining an SEP arrangement or an imaging magnification. Accordingly, determination of the SEP arrangement or imaging magnification that preferably does not allow the inhibition area to be contained in an overlap area is accomplished. In addition, the inhibition area is, similarly to the adjacent link information or arbitrary link information, displayed together with the SEP arrangement through a GUI. Accordingly, a user can easily decide whether a pattern concerned (for example, an OPC pattern) is contained in the inhibition area. An example of GUI display will be described later.

2.6 Joining SEP Images

In order to join pickup images of determined SEPs through image processing, alignment has to be performed so that a degree of superposition (correlation value) of a pattern contained in an overlap area between SEPs gets higher. However, since plural overlap areas exist, all the correlation values in the overlap areas cannot be maximized (when the correlation value in a certain overlap area is maximized, the correlation value in any other overlap area may decrease). Therefore, when the pickup images of SEPs are joined through image processing, a degree to which the correlation value in each overlap area is taken into consideration is set as a weight on the basis of information in the adjacent link information or arbitrary link information which is concerned with whether SEPs can be joined or are easy to join. Joining is performed so that the correlation value in an overlap area for which a large weight is set tends to get higher.

For example, a correlation value in an overlap area which makes it hard to achieve joining, for example, an overlap area in which a pattern serving as a key to joining is not contained at all is calculated based on an image noise alone. Therefore, there is a risk that joining of SEPs causing the correlation value, which is calculated based on the image noise, to get higher may bring about a large positional deviation.

Figure 11A:
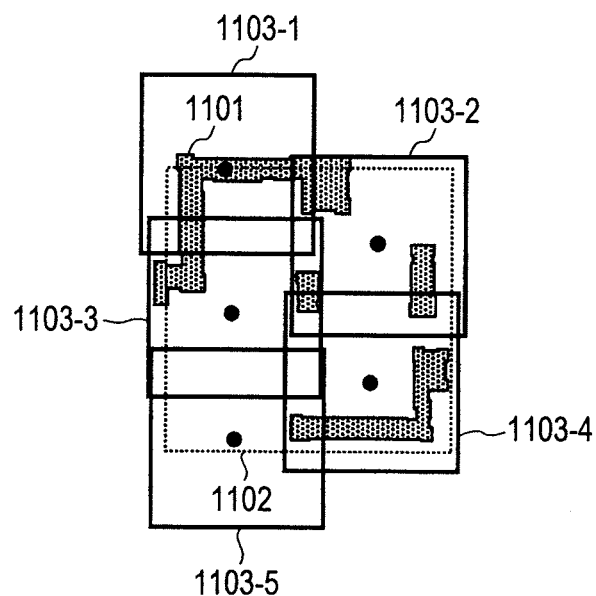
FIG. 11A is a diagram showing an example in which an EP is divided into five SEPs on the basis of inputted EP information and design information.
Figure 11B:
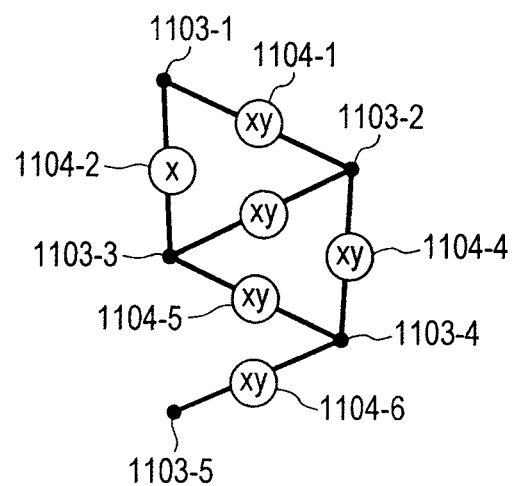
FIG. 11B is a diagram showing a result of having calculated adjacent link information in the arrangement of the five divided SEPs.
Figure 11C:
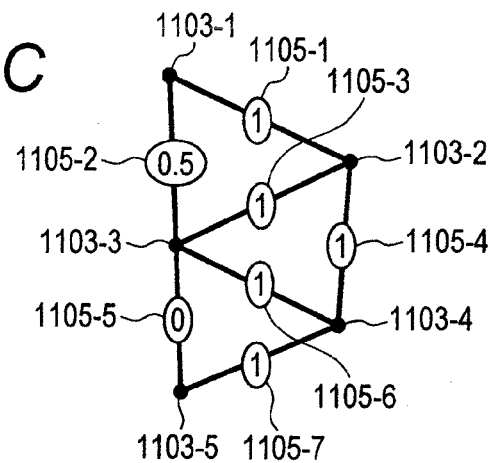
FIG. 11C is a diagram showing a result of having set a weight of a degree, to which a correlation value is taken into account, for each of overlap areas on the basis of the calculated adjacent link information.

A concrete example will be described in conjunction with FIG. 11A to FIG. 11E. FIG. 11A shows a result of having divided design information (1101) and an EP (1102), which are inputted, into five SEPs (1103-1 to 1103-5). FIG. 11B shows a result of having calculated adjacent link information (whether joining of two adjoining SEPs can be joined or not) for an SEP arrangement shown in FIG. 11A (1104-1 to 1104-6). FIG. 11C shows a result of having set weights of degrees (1105-1 to 1105-7), to which correlation values in respective overlap areas are taken into consideration, on the basis of the calculated adjacent link information shown in FIG. 11B. In this example, a weight for SEPs that can be joined in both the x and y directions is set to 1, a weight for SEPs that can be joined in either of the x and y directions is set to 0.5, and a weight for SEPs sharing an overlap area in which no pattern is contained is set to 0.

Figure 11D:
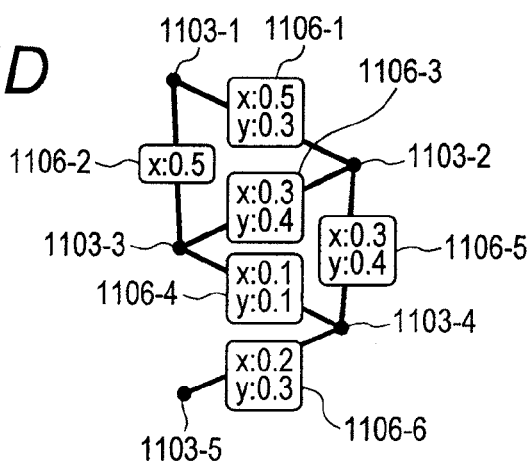
FIG. 11D is a diagram showing a result of having calculated easiness of joining between two adjoining SEPs in the arrangement of the five segmented SEPs.
Figure 11E:
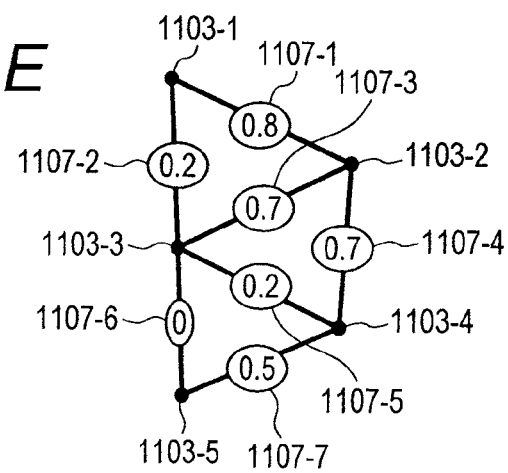
FIG. 11E is a diagram showing a result of having set a weight for each of the overlap areas on the basis of the calculated ease of joining between two adjoining SEPs.

Specifically, a priority to alignment of each SEP with an SEP to be joined with the SEP in the x and y directions is raised, and a priority to alignment thereof with an SEP with which the SEP shares an overlap area in which no pattern is contained is lowered. FIG. 11D shows a result of having calculated easiness of joining between two adjoining SEPs in the SEP arrangement in FIG. 11A (1106-1 to 1106-6). FIG. 11E shows a result of having set weights for overlap areas on the basis of the easiness of joining among SEPs shown in FIG. 11D (1107-1 to 1107-6).

2.7 Producing Pattern Outlines

By joining a group of SEM images picked up by imaging SEPs determined as mentioned above, a wide-range and high-resolution panoramic SEM image can be acquired.

As a method of extracting wide-range and high-resolution pattern outlines, two methods to be described below are available as shown in FIG. 12A to 12E.

Figure 12A:
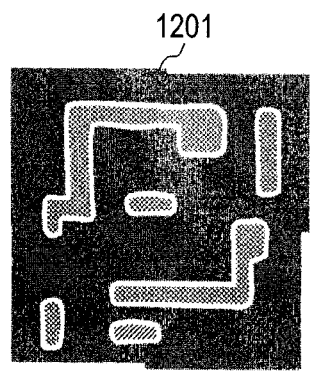
FIG. 12A is a diagram showing a panoramic image of a wide range produced by joining plural SEP images.
Figure 12B:
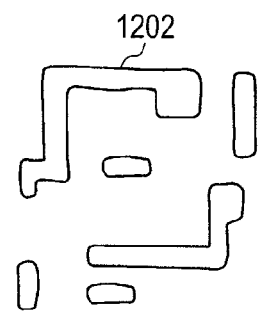
FIG. 12B is a diagram showing an example in which pattern outlines in the wide range are extracted from the panoramic image.
Figure 12C:
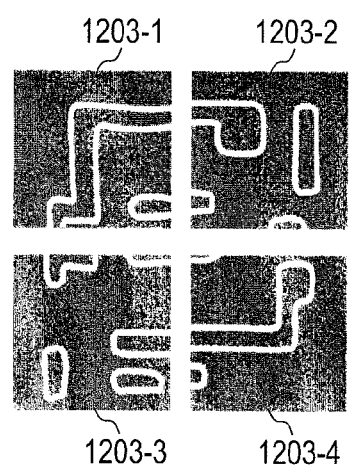
FIG. 12C is a diagram showing a group of SEP images obtained by imaging plural SEPs.
Figure 12D:
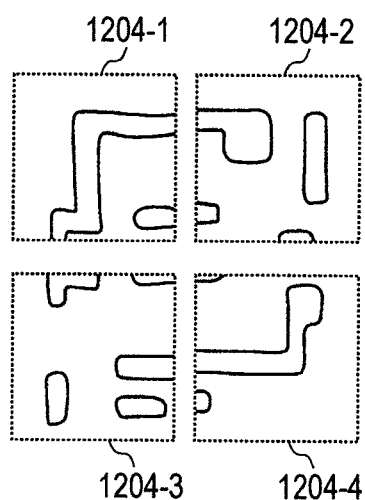
FIG. 12D is a diagram showing a state in which a group of pattern outlines is obtained by extracting outlines from each of the plural SEP images.

- As shown in FIG. 12A, a wide-range panoramic image is obtained by joining a group of SEP images, which is obtained by imaging plural SEPs using an SEM, through image processing (1201). Wide-range pattern outlines shown in FIG. 12B are extracted from the panoramic image (1202).
- A group of SEP images shown in FIG. 12C is obtained by imaging plural SEPs using an SEM (1203-1 to 1203-4). A group of pattern outlines shown in FIG. 12D is obtained by extracting pattern outlines from each of the group of SEP images (1204-1 to 1204-4), and joined in order to obtain wide-range pattern outlines shown in FIG. 12E (1205).

2.8 Overall Flow

Figure 13A:
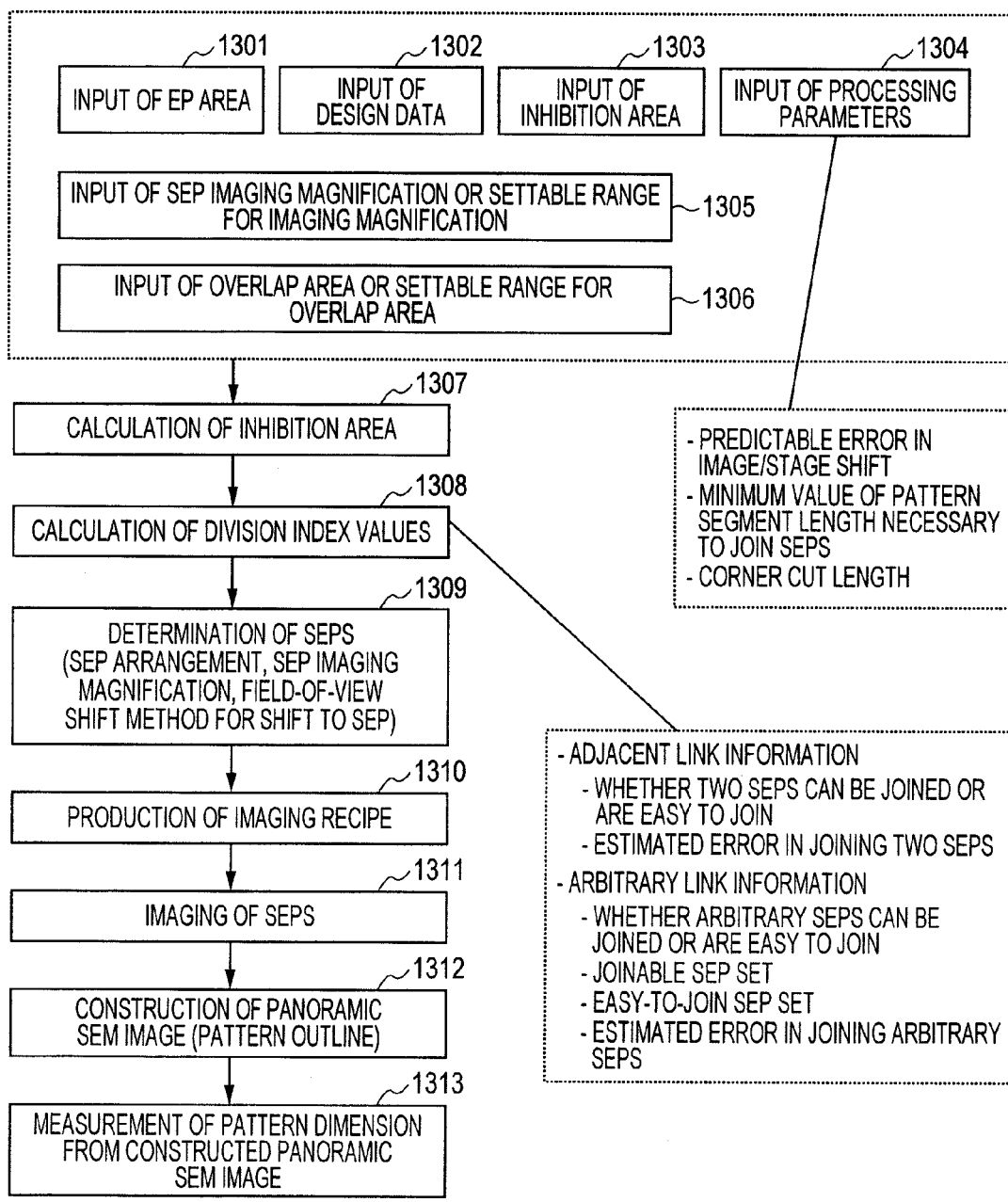
FIG. 13A is a flowchart showing a flow of a series of pieces of processing ranging from inputting of EP area information and design data, through construction of a high-magnification panoramic image from high-magnification SEM images obtained by imaging a specimen, to measurement of a pattern dimension.

An overall flow of panoramic image construction processing and pattern dimension measurement using a constructed panoramic image will be described in conjunction with FIG. 13A. First, an area of an EP and design information on semiconductor circuits or mask patterns are inputted (steps 1301 and 1302 respectively). The EP refers to an imaging range of a panoramic image to be acquired. As coordinates of the EP, coordinates of a hot spot (risky point) at which a device malfunction is likely to occur and which is detected based on a result of exposure simulation or the like to be executed by an electronic design automation (EDA) tool may be inputted. Otherwise, coordinates may be inputted based on a user's own decision (at this time, if necessary, information of the EDA tool is referenced).

If necessary, an area containing a user-designated pattern may be inputted as an inhibition area (step 1303). As an inhibition area inputting method, a user may directly input coordinates or a range or may designate an area while looking at design information through a GUI. Further, if necessary, processing parameters can be inputted (step 1304).

As the processing parameters, a predictable stage/image shift error, a pattern segment length in an overlap area that is minimally needed for joining, a corner cut length of a design pattern (since an actual pattern formed on a semiconductor wafer may have a corner thereof rounded or may have the shape thereof dissociated from design information, this parameter is used to cut design pattern data within a certain range), and others can be designated. In addition, if necessary, an SEP imaging magnification or a settable range for the SEP imaging magnification can be inputted. In addition, if necessary, an overlap area width between SEPs or a settable range for the overlap area width between SEPs can be inputted. At an inhibition area calculation step (1307), in addition to an inhibition area inputted at step 1303, a user-designated pattern is automatically extracted as an inhibition area. The inhibition area may be automatically designated based on index values obtained by evaluating the complexities of the shapes of patterns on the basis of design information, or a risky point at which a device malfunction is likely to occur and which is outputted from an EDA tool or the like.

An SEP arrangement or SEP imaging magnification is determined at an SEP determination step (step 1309) on the basis of division index values calculated at an inhibition area or division index value calculation step (step 1308) by evaluating whether SEPs can be joined or are easy to join. The SEP imaging magnification can be inputted at step 1305. In imaging SEPs, a field-of-view displacement deriving from image shift or stage shift takes place. Therefore, when the SEPs are determined, there is a risk that even if evaluation reveals that a pattern serving as a key to joining is contained in an overlap area, the pattern that is supposed to be contained may in reality get out of the overlap area due to the field-of-view displacement.

Maximum field-of-view displacement volumes that are estimated to be derived from image shift and stage shift respectively are inputted (step 1304). SEPs are determined within a range in which they can be joined despite occurrence of the maximum field-of-view displacements, whereby the SEPs that are robust to the field-of-view displacements can be determined. Whichever of the methods of the image shift and stage shift should be adopted in order to scroll SEPs depends on an SEP imaging sequence. Therefore, at an SEP determination step, a difference in the field-of-view displacement dependent on a difference in the scrolling method is taken into account in order to determine an SEP arrangement, SEP imaging magnification, and scrolling method for SEPs.

Thereafter, the SEP arrangement, SEP imaging magnification, and scrolling method for SEPs which are determined at step 1309 are preserved as an imaging recipe (step 1310).

Thereafter, based on the imaging recipe produced at step 1310, plural SEPs are sequentially imaged using an SEM (step 1311).

Thereafter, at step 1312, a group of SEP images picked up from the plural SEPs is joined through image processing in order to produce a panoramic image. In addition, wide-range pattern outlines may be extracted from the panoramic image. For obtaining the wide-range pattern outlines, plural SEPs may be imaged using an SEP in order to pick up a group of SEP images, pattern outlines may be extracted from each of the group of SEP images in order to acquire a group of pattern outlines, and the group of pattern outlines may be then joined.

Figure 12E:
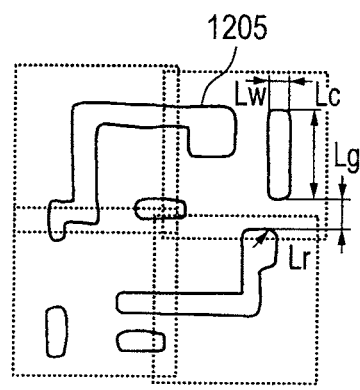
FIG. 12E is a diagram showing an example in which pattern outlines in the wide range are produced by joining the group of pattern outlines extracted from the SEP images.

At step 1313, a constructed panoramic SEM image is processed in order to measure, for example, as shown in FIG. 12E, such a pattern dimension as an inter-pattern gap Lg, pattern width dimension Lw, or pattern length Ll, and shape information such as a roundness Lr of a pattern.

Figure 13B:
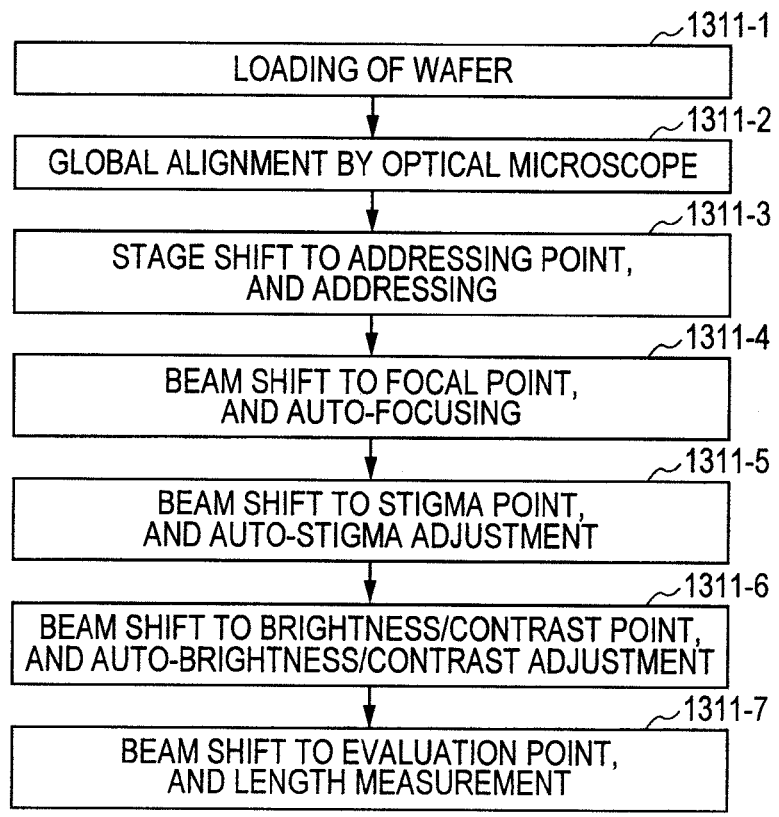
FIG. 13B is a flowchart showing a detailed flow of SEP imaging.

Next, a detailed procedure for imaging plural SEPs at step 1311 will be described based on FIG. 13B in reference to the SEM system shown in FIG. 1.

To begin with, at step 1311-1 in FIG. 13B, a semiconductor wafer or mask that is a specimen (hereinafter, referred to as a specimen) is loaded on the stage 121 of the SEM device. At step 1311-2, an optical microscope or the like (not shown in the SEM system in FIG. 1) is used to observe a global alignment mark on the wafer so as to correct a displacement of the wafer from an origin or a rotational angle of the wafer.

At step 1311-3, the processing/control unit 115 controls the stage controller 110 so as to allow the stage controller 110 to move the stage 117. The position of a specimen is adjusted so that an imaging position dependent on an SEM is set to an addressing point (hereinafter, AP), and the specimen is imaged. Addressing parameters are obtained, and addressing is performed based on the obtained parameters.

Now, an AP will be described below. When SEPs are observed, if an attempt is made to directly observe the SEPs, there arises a possibility that an imaging point may be largely displaced due to a stage positioning error and may be deviated from the field of view of an SEM. Therefore, an AP whose coordinates and template (patterns at an imaging point) are given in advance is observed for positioning. The template at the imaging point is registered in an imaging recipe. Hereinafter, the template at the imaging point shall be referred to as an AP registration template. The AP is selected from among points near an SEP (within a range of points capable of being scrolled through beam shift). The AP is generally a low-magnification field of view for the SEP. Therefore, the possibility that when an imaging position is a bit displaced, patterns that should be imaged may fully get out of the field of view of the SEM is held low. By matching an AP registration template, which has been registered in advance, with an SEM image of the actually imaged AP (actual imaging template), a positional deviation volume of an imaging point at the AP can be estimated. Since the coordinates of the AP and SEP are already known, a relative displacement volume between the AP and SEP can be obtained. In addition, the positional deviation volume of the imaging point at the AP can be estimated through the matching. Therefore, by subtracting the positional deviation volume from the relative displacement volume, a relative displacement volume from an AP imaging position to the SEP by which the imaging position should actually be shifted can be obtained. When the imaging position is shifted by the relative displacement volume (with the stage 121 at a halt) through beam shift of high positional precision, the SEP can be imaged with high coordinate precision.

Therefore, an AP to be registered should preferably satisfy such conditions as a condition (1) that patterns should exist at a distance by which an imaging position can be shifted from an SEP through beam shift (a field of view (FOV) for imaging the SEP should not be contained in or overlapped with a FOV for imaging the AP in order to suppress occurrence of contamination at the SEP), a condition (2) that an imaging magnification for the AP should be lower than an imaging magnification for the SEP in consideration of precision in positioning the stage, and a condition (3) that pattern shapes or lightness patterns should be unique and an AP registration template and an actual imaging template should be easily matched with each other. By evaluating above conditions in the system when selecting a place for AP, an appropriate AP can be selected and an imaging sequence can be determined.

An AP registration template that is registered in advance may be a CAD image or an SEM image. Otherwise, as a variation, a SEM image of an AP that is obtained during actual imaging and tentatively registered as a CAD data template may be re-registered as an SEM image template.

The AP selection range will be supplemented below. In general, a coordinate on which an electron beam incidents perpendicularly is set to a central coordinate among plural SEPs. The AP selection range is at a maximum a beam-shift enabling range with an SEP as a center. However, in case a coordinate on which an electron beam incidents perpendicularly is different from the central coordinate among plural SEPs, the beam-shift enabling range from the coordinate on which the electron beam incidents perpendicularly is adopted as the selection range. Depending on a permissible electron beam incident angle which an imaging point is requested to satisfy, a searchable range from the coordinate on which the electron beam incidents perpendicularly may be smaller than the beam-shift enabling range. The same applies to the other templates. Hereinafter, unless otherwise noted, as far as imaging of SEPs is concerned, the coordinate on which the electron beam incidents perpendicularly shall be described as being identical to the central coordinates among the SEPs. However, the present invention is not limited to this definition.

Thereafter, at step 1311-4, an imaging position is shifted to an autofocus point (hereinafter, an AF) through beam shift under the control and processing of the processing/control unit 115, and then imaged. Autofocusing parameters are obtained, and autofocusing is performed based on the obtained parameters.

Now, an AF will be described below. For imaging, autofocus is performed in order to acquire a sharp image. If an electron beam is irradiated to a specimen for a long period of time, a contaminant adheres to the specimen (contamination). In order to suppress contamination or adherence of the contaminant to an SEP, a coordinate on the perimeter of the SEP is selected and a position on the coordinate is observed as an AF. After autofocusing parameters are obtained by the observation of the selected point, an EP is observed based on the obtained autofocus parameters.

Therefore, an AF to be registered should preferably satisfy such conditions as a condition (1) that patterns should exist at a distance by which an imaging position can be shifted from an AP or SEP through beam shift, and an FOV for imaging an EP should not be contained in or overlapped with an FOV for imaging the AF, a condition (2) that an imaging magnification for the AF should be on a level with an imaging magnification for the SEP (however, this applies to a case where the AF is used for the SEP. When the AF is used for the AP, the AF is imaged at an imaging magnification that is on a level with the imaging magnification for the AP. The same applies to an AST and ABCC to be described later.), and a condition (3) that pattern shapes at the AF should be easily autofocused (a blurred image caused by an out-of-focus state can be easily detected). According to an embodiment of the present invention, even in AF selection, similarly to AP selection, the above-described conditions are evaluated in the system, and an appropriate AF can be automatically selected.

Next, at step 1311-5, an imaging position is shifted to an auto-stigma point (hereinafter, an AST) through beam shift under the control and processing of the processing/control unit 115, and then imaged. Parameters for auto-stigma adjustment are obtained, and auto-stigma adjustment is performed based on the obtained parameters.

Now, an AST will be described below. For imaging, astigmatism compensation is performed in order to acquire an image without a distortion. Similarly to the case of the AF, if an electron beam is irradiated to a specimen for a long period of time, a contamination adheres to the specimen. In order to suppress contamination or adherence to an SEP, a position having a coordinate near the SEP is observed as the AST. Parameters for the astigmatism compensation are obtained, and the SEP is observed based on the parameters.

Therefore, an AST to be registered should preferably satisfy such conditions as a condition (1) that patterns should exist at a distance by which an imaging position is shifted from an AP or SEP through beam shift, and an FOV for imaging an EP should not be contained in or overlapped with an FOV for imaging the AST, a condition (2) that an imaging magnification for the AST is on a level with an imaging magnification for the SEP, and a condition (3) that pattern shapes should be easily subjected to astigmatism compensation (a blurred image caused by astigmatism can be easily detected).

According to the present embodiment, even in AST selection, similarly to AT selection, the above-described conditions can be evaluated in the system, and an appropriate AST can be automatically selected.

Next, at step 1311-6, under the control and processing of the processing/control unit 115, an imaging position is shifted to an auto-brightness and contrast point (hereinafter, an ABCC) through beam shift, and then imaged in order to obtain parameters for brightness/contrast adjustment. Brightness/contrast adjustment is then performed based on the obtained parameters. Now, the ABCC will be described below. For imaging, in order to acquire a sharp image that has a proper lightness and contrast, parameters including, for example, a voltage value of a photomultiplier tube in the secondary electron detector 109 is adjusted in order to set, for example, the highest part of an image signal and the lowest part thereof to a level of a full contrast or a nearly full contrast. However, similarly to the case of the AF, if an electron beam is irradiated to a specimen for a long period of time, a contaminant adheres to the specimen. In order to suppress contamination or adherence of contaminant to an EP, a position having a coordinate near the EP is tentatively observed as the ABCC. After parameters for brightness/contrast adjustment are obtained, the EP is observed based on the parameters.

Therefore, an ABCC to be registered preferably satisfies such conditions as a condition (1) that patterns should exist at a distance by which an imaging position is shifted from an AP or SEP through beam shift, and an FOV for imaging the SEP should not be contained in or overlapped with an FOV for imaging the ABCC, a condition (2) that an imaging magnification for the ABCC should be on a level with an imaging magnification for the SEP, and a condition (3) that the patterns at the ABCC should be analogous to patterns at a length measurement point for a better brightness or contrast of an image picked up from the length measurement point using parameters adjusted at the ABCC. According to an embodiment of the present invention, even in ABCC selection, similarly to AP section, the conditions can be evaluated in the system, and an appropriate ABCC can be automatically selected.

Incidentally, as variations, imaging of the AP, AF, AST, and ABCC at steps 1311-3, 1311-4, 1311-5, and 1311-6 respectively may be partly or entirely omitted, the order of the steps 1311-3, 1311-4, 1311-5, and 1311-6 may be arbitrarily changed, or any of coordinates of the AP, AF, AST, and ABCC may coincide with any other thereof (for example, autofocus and auto-stigma may be performed at the same point).

Finally, at step 1311-7, an imaging point is shifted to an SEP through beam shift, and SEPs are sequentially imaged by the number of pickup images determined at step 1309.

Thereafter, at the aforesaid step 1312, plural SEM images of the SEPs imaged by plural pickup images are synthesized.

Figure 13C:
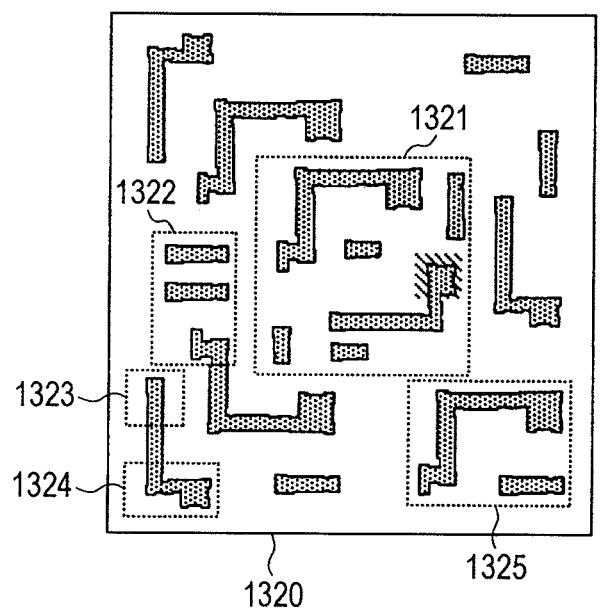
FIG. 13C is a plan view of specimen patterns showing examples of positions of an EP, AP, AF, AST, and ABCC to be treated in the detailed flow of SEP imaging.

Even at an SEP, when the picked up SEM image is matched with a registration template associated with the SEP position registered preliminarily in an imaging recipe, a deviation of a measured position may be detected. In the imaging recipe composed by the imaging recipe composer 122, pieces of information such as the coordinates of the imaging points (SEP, AP, AF, AST, ABCC), imaging sequence, and imaging conditions are written. An SEM observes the SEP on the basis of the imaging recipe. FIG. 13C shows examples of template positions of an SEP 1321, AP 1322, AF 1323, AST 1324, and ABCC 1325 in a low-magnification image 1320 in the form of dotted frames.

According to the present embodiment, a high-magnification SEM image of a relatively wide area that cannot be acquired by performing imaging at once is used to measure a dimension of a pattern or evaluate a pattern shape.

3. SEP Determination Through Selection of SEP Candidates

At the SEP determination step described in section 2, an SEP arrangement that satisfies all user requests may not exist in principle. For example, when SEPs are determined in line with a designated imaging magnification, it becomes hard to join all the SEPs, and to make all SEPs be joinable, an imaging magnification for the SEPs cannot help being smaller than a designated value.

Figure 14:
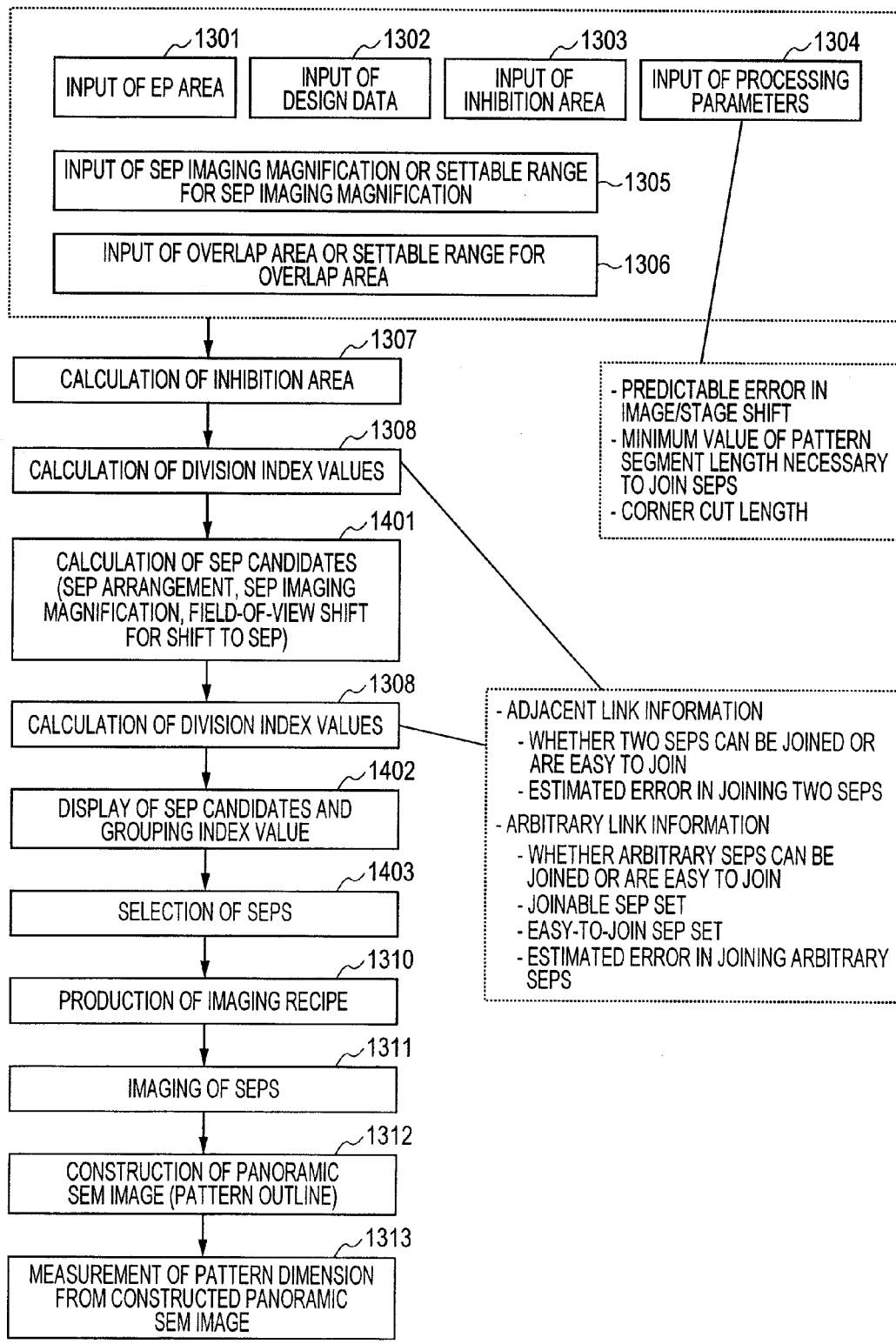
FIG. 14 is a flowchart showing an overall processing flow including SEP determination through user selection.

As a second embodiment, there is provided a method of determining as a quasi-optimal solution for an SEP arrangement that satisfies as many user requests as possible even in the above case. A flow of this processing will be described in conjunction with FIG. 14.

This processing is characterized in that after conditions for panoramic image construction processing are inputted (steps 1301 to 1306) and an inhibition area is calculated (step 1307), plural candidates for an SEP arrangement (hereinafter, called SEP candidates) which are different from one another in imaging positions or an imaging magnification for SEPs are calculated based on division index values calculated at step 1308 (step 1401). As a means for determining a quasi-optimal solution from the candidates, the candidates are displayed in a GUI, and adjacent link information or arbitrary link information is displayed as a criterion (step 1402). SEPs are selected from the group of SEP candidates (step 1403).

For SEP selection, an SEP arrangement and information serving as a key to selection of an SEP candidate are presented to a user. The user can easily decide whether each of SEP candidates satisfies user's request items, and can select an appropriate SEP candidate.

As user's request items, for example, an arrangement of SEPs, an SEP imaging magnification, easiness of joining of SEPs, an overlap volume between an inhibition area and an overlap area between SEPs, an inter-SEP overlap area width, and the number of SEPs (the smaller the number of SEPs is, the shorter an imaging time is) are cited. When the items are visualized in the GUI in such a manner that the items can be easily understood by a user, the user can easily select an SEP candidate.

Figure 15A:
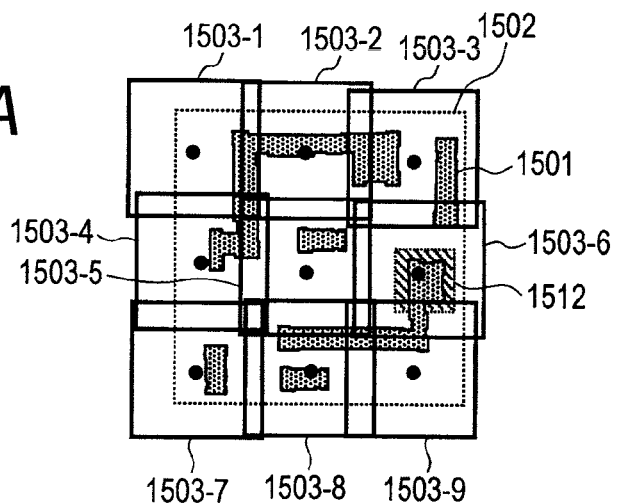
FIG. 15A is a diagram showing an example in which an EP is divided into nine SEPs on the basis of inputted EP information and design information.
Figure 15B:
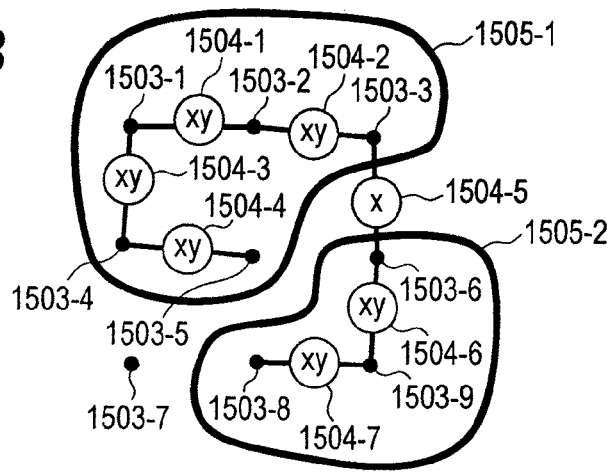
FIG. 15B is a diagram showing an example in which the nine SEPs are grouped into two joinable SEP sets on the basis of a result of having calculated adjacent link information in the arrangement of the nine SEPs.
Figure 15C:
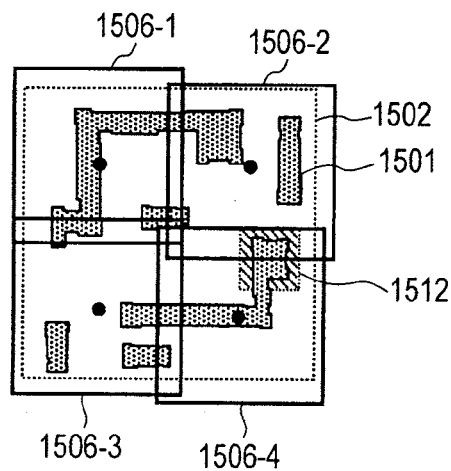
FIG. 15C is a diagram showing an example in which an EP is divided into four SEPs on the basis of inputted EP information and design information.
Figure 15D:
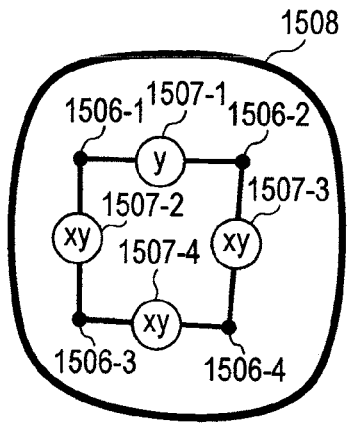
FIG. 15D is a diagram showing an example in which all SEPs are made joinable on the basis of a result of having calculated connectional link information in the arrangement of the four SEPs.
Figure 15E:
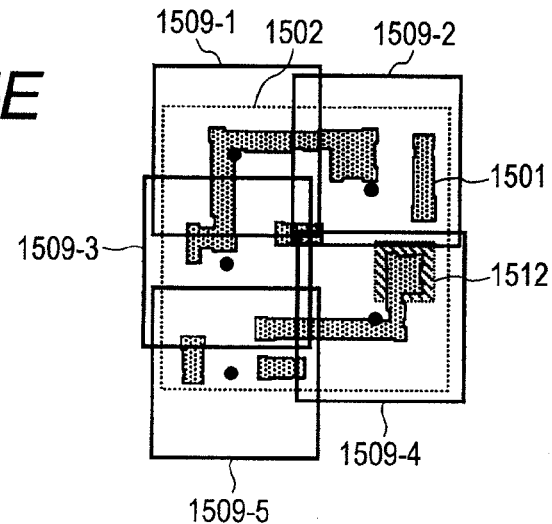
FIG. 15E is a diagram showing an example in which an EP is divided into five SEPs on the basis of inputted EP information and design information so that the area of an inhibition area containing an overlap area gets smaller than that in the case shown in FIG. 15C.
Figure 15F:
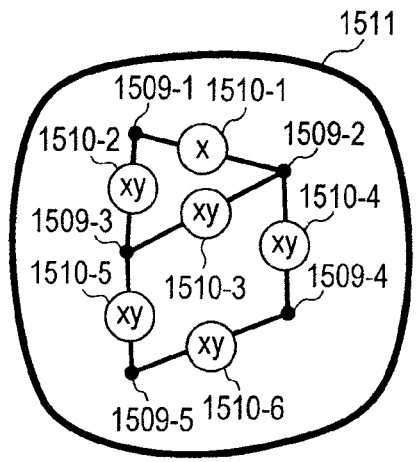
FIG. 15F is a diagram showing an example in which all SEPs are made joinable on the basis of a result of having calculated connectional link information in an arrangement of five SEPs.

FIG. 15A to FIG. 15F show examples of calculation of SEP candidates. FIG. 15A to FIG. 15F show three SEP candidates for design information (1501) and an EP (1502) that are inputted. Reference numerals 1503-1 to 1503-9 in FIG. 15A and FIG. 15B, reference numerals 1506-1 to 1506-4 in FIG. 15C and FIG. 15D, and reference numerals 1509-1 to 1509-5 in FIG. 15E and FIG. 15F denote respective SEP arrangements. Reference numerals 1504-1 to 1504-7 in FIG. 15B, reference numerals 1507-1 to 1507-4 in FIG. 15D, and reference numerals 1510-1 to 1510-6 in FIG. 15F denote pieces of adjacent link information for the respective SEP arrangements. In FIG. 15B, all SEPs are grouped into two joinable SEP sets 1501-1 and 1501-2. In FIG. 15D and FIG. 15F, all SEPs are joinable (1508 and 1511).

Namely, the SEP arrangement in FIG. 15A offers a high SEP imaging magnification but does not allow all SEPs to be joined. In contrast, in FIG. 15C to FIG. 15F, an SEP imaging magnification is lower than that in FIG. 15A, but all SEPs can be joined. In FIG. 15E and FIG. 15F, compared with FIG. 15C and FIG. 15D, an inter-SEP overlap area width is large and the number of SEPs is large. However, the area of the inhibition area (1512) contained in an overlap area is small.

As mentioned above, since there is a trade-off among an SEP imaging magnification, easiness of joining, and an overlap volume between an inhibition area and overlap area, an SEP arrangement that meets the three requirements is hard to determine. However, even when the SEP arrangement that satisfies all the user's request items cannot be determined, if pieces of information concerning the user's request items are visualized as they are like this example, a user can easily determine an SEP arrangement, which satisfies the user's request items as many as possible, as a quasi-optimal solution. In addition, as a variation of piece of information to be presented to the user, a result of having grouped SEPs into sets of mutually joinable SEPs or a result of having grouped SEPs into SEP sets each of which includes SEPs whose easiness of joining are on a level with one another may be presented. In addition, positional deviation volumes estimated when SEPs are actually joined (estimated positional deviation volumes) or values calculated based on the positional deviation volumes may be presented.

Herein, the estimated positional deviation volumes are calculated based on positional deviation volumes obtained by actually joining pseudo SEM images of SEPs estimated using design information. Calculation of the estimated positional deviation volumes requires much processing time because it needs image production and joining. Therefore, the estimated positional deviation volumes may be calculated for all calculated SEP candidates or only for a designated SEP candidate, and then displayed.

4. GUI

Figure 16:
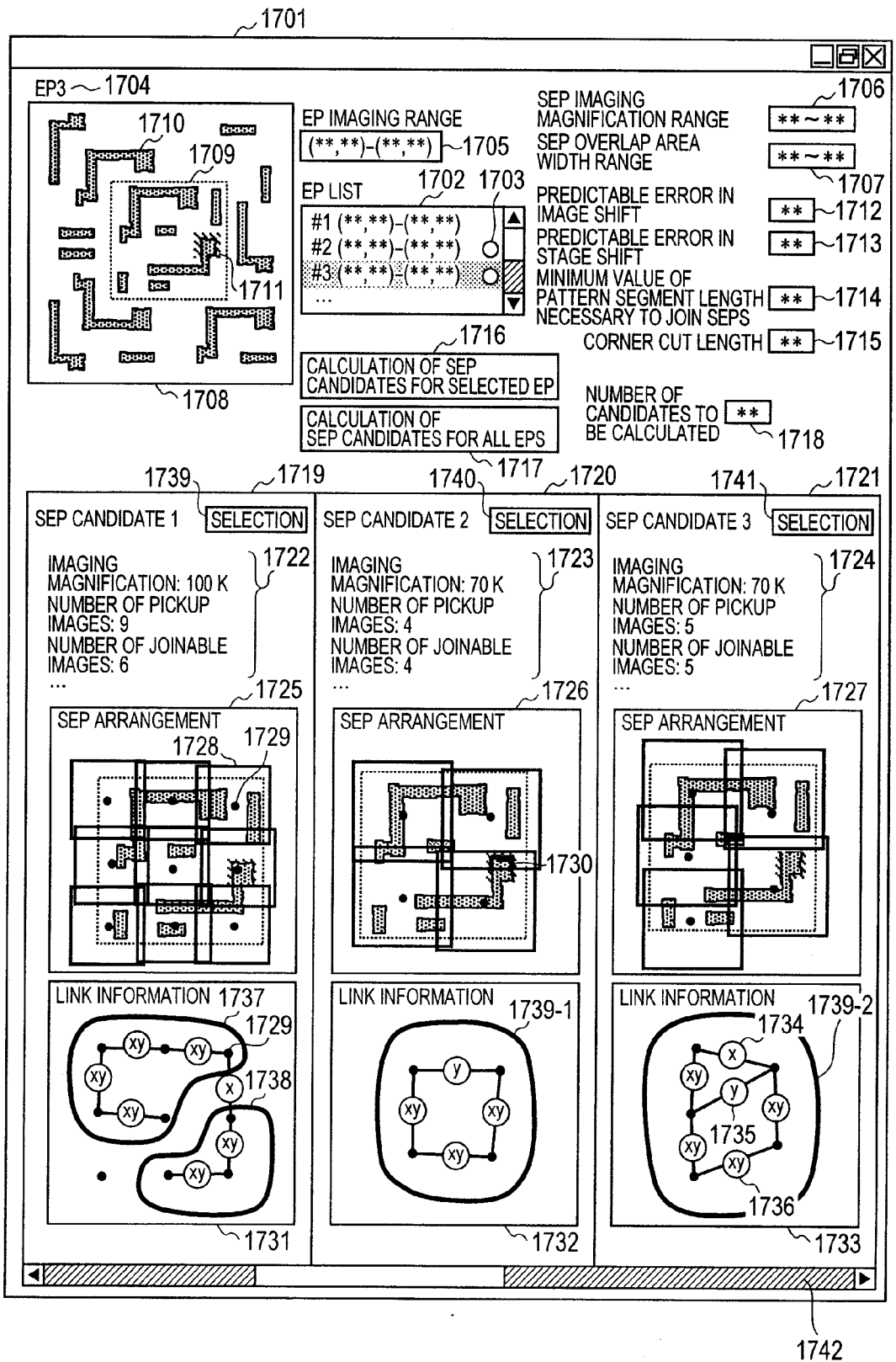
FIG. 16 is a diagram showing an example of a GUI screen image.

FIG. 16 shows an example of a GUI through which input/output information is set or displayed. Various pieces of information rendered in one screen image within a window 1701 shown in FIG. 16 can be arbitrarily combined, allocated to windows, and shown on a display or the like. In addition, ** in the drawing denotes an arbitrary numerical value (or character string) that is inputted to the system or outputted, or a range of numerical values.

A box 1702 presents a list of EPs that may become an object of panoramic image construction processing. An EP may be selected from the list and subjected to the panoramic image construction processing, or the panoramic image construction processing may be performed on all the EPs as batch processing. When the batch processing is performed, the EPs to be processed may be checked (1703) and only the EPs may be processed. In this example, the third EP in the list of EPs is selected. Reference numeral 1704 denotes an ID of the selected EP. A box 1705 presents an imaging range for the selected EP. The imaging range may be defined with coordinates of a left upper point of a rectangular area and coordinates of a right lower point thereof, or may be defined with central coordinates of the EP and a field of a view. An SEP imaging magnification range can be set in a box 1706, and an inter-SEP overlap area width range can be set in a box 1707.

For inputting a range, a lower limit and upper limit of the range may be designated. When the lower limit and upper limit are set to the same value, an SEP imaging magnification and inter-SEP overlap width can be designated. A box 1708 presents patterns at an EP and those in the perimeter of the EP. The range of the EP is indicated with a dotted frame (1709), and design information on circuits or mask patterns in the perimeter of the EP is expressed with graphics (1710) that are hatched like a net. In addition, an inhibition area that is manually set or automatically set based on the design information is expressed with an area (1711) that is hatched with slant lines. In boxes 1712 to 1715, processing parameters for SEP determination (a predictable image/stage shift error, a minimum value of a pattern segment length necessary to join SEPs, a corner cut length, and others) can be set.

After the EP, SEPs, and processing parameters are set, if a button 1716 is depressed, candidates for SEPs are calculated for the selected EP. If a button 1717 is depressed, an SEP candidate is calculated for all the EPs ticked in the EP list.

In batch processing, after SEP candidates are calculated for each EP concerned, a user may select an SEP candidate for the EP. In addition, the number of SEP candidates to be calculated can be designated in a box 1718.

Boxes 1719 to 1721 present three SEP candidates calculated for the selected EP. Reference numerals 1722 to 1724 denote pieces of detailed information on the respective SEP candidates. In this case, the SEP candidate 1 exhibits an SEP arrangement that offers an imaging magnification of 100 k (100,000) and includes nine SEPs. Among the nine SEPs, a maximum number of mutually joinable SEPs is four.

Boxes 1725 to 1727 present SEP arrangements of the respective SEP candidates. In the drawing, a black frame (1728) indicates an SEP, and a black dot (1729) indicates central coordinates. For displaying the SEP candidate, similarly to the box 1708, design information, an EP, and an inhibition area may be displayed while being superposed on one another. A pattern within the inhibition area contained in an overlap area may be highlighted with a bold line (1730).

Boxes 1731 to 1733 present pieces of link information relevant to the SEP arrangements presented in the boxes 1725 to 1727 respectively. The adjacent link information can be expressed with symbols having x, y, and xy respectively enclosed in circles, and black lines linking SEPs. The symbols signify that SEPs can be aligned in the x direction (1734), SEPs can be aligned in the y direction (1735), or SEPs can be aligned in the x and y directions (1736). In addition, the SEPs can be grouped into sets of mutually joinable SEPs (joinable SEP sets), and the center position among SEPs belonging to each of the grouped SEP sets can be enclosed with a bold black frame.

In the present example, the SEP candidate 1 is shown to be segmented into two joinable SEP sets 1737 and 1738, and thus signifies that all the SEPs cannot be joined. In contrast, the SEP candidate 2 and SEP candidate 3 are shown to have all SEPs enclosed with a bold black frame 1739-1 or 1739-2, and thus signify that all the SEPs can be joined.

As information to be presented, easiness of joining among SEPs like those shown in FIG. 3 may be presented. In addition, a result of, like the one shown in FIG. 8, having grouped all the SEPs into SEP sets each of which includes SEPs whose degrees of easiness of joining are on a level with one another (easy-to-join SEP sets) may be presented. In this case, as shown in FIG. 5, whether arbitrary SEPs can be joined in each of the x and y directions may be presented.

A user selects SEPs by depressing any of buttons 1739 to 1741 using information, which signifies a relationship of association between an SEP arrangement of each SEP candidate and SEPs, as a criterion. In the present example, three SEP candidates are presented. Alternatively, other SEP candidates may be calculated. In this case, by sliding a scroll bar 1742, any other SEP candidate can be seen.

In display of SEP candidates, priorities for display may be assigned to the respective SEP candidates, and the SEP candidates may be displayed in descending order of the priority for display. As for the priority for display, a priority may be set by evaluating to what extent user's request items such as an SEP imaging magnification, easiness of joining, and an overlap volume between an inhibition area and an overlap area are satisfied.

Figure 17:
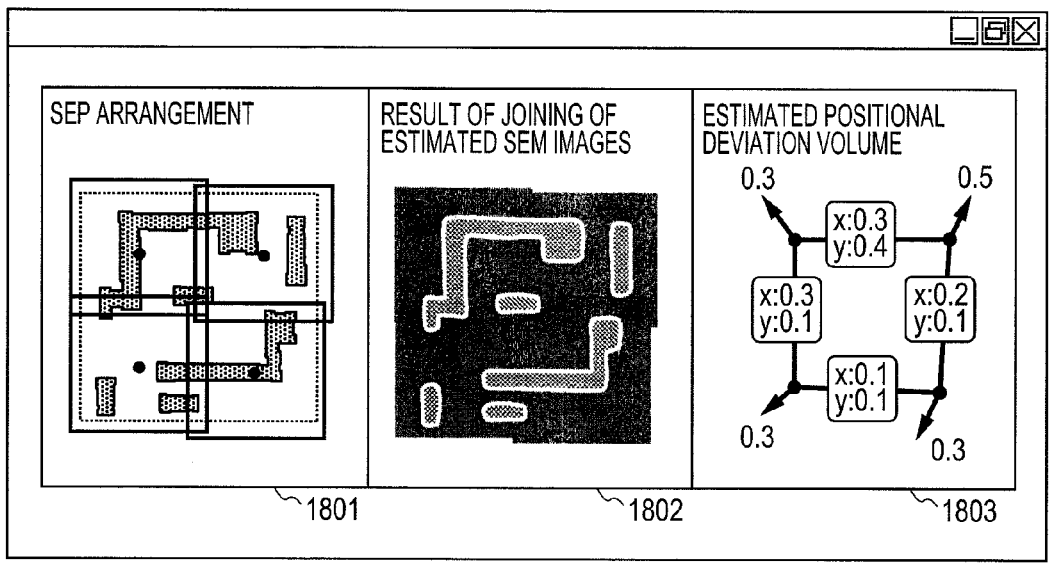
FIG. 17 is a diagram showing an example of the GUI screen image.

As a variation of detailed information on an SEP candidate, estimated positional deviation volumes to be obtained when joining processing is actually performed may be displayed as shown in FIG. 17. As for the estimated positional deviation volumes, pseudo SEM images produced from a determined SEP arrangement (1801) and design information may be joined (1802), and positional deviation volumes occurring at this time may be displayed in relation to respective SEPs or adjoining SEPs (1803). Relative positional deviation volumes among SEPs estimated in each of the x and y directions may be displayed. Instead of the relative positional deviation volumes among SEPs, absolute positional deviation volumes of the respective SEPs with respect to a certain reference may be displayed. In addition, a direction and magnitude of a positional deviation may be expressed with an arrow.

Figure 18:
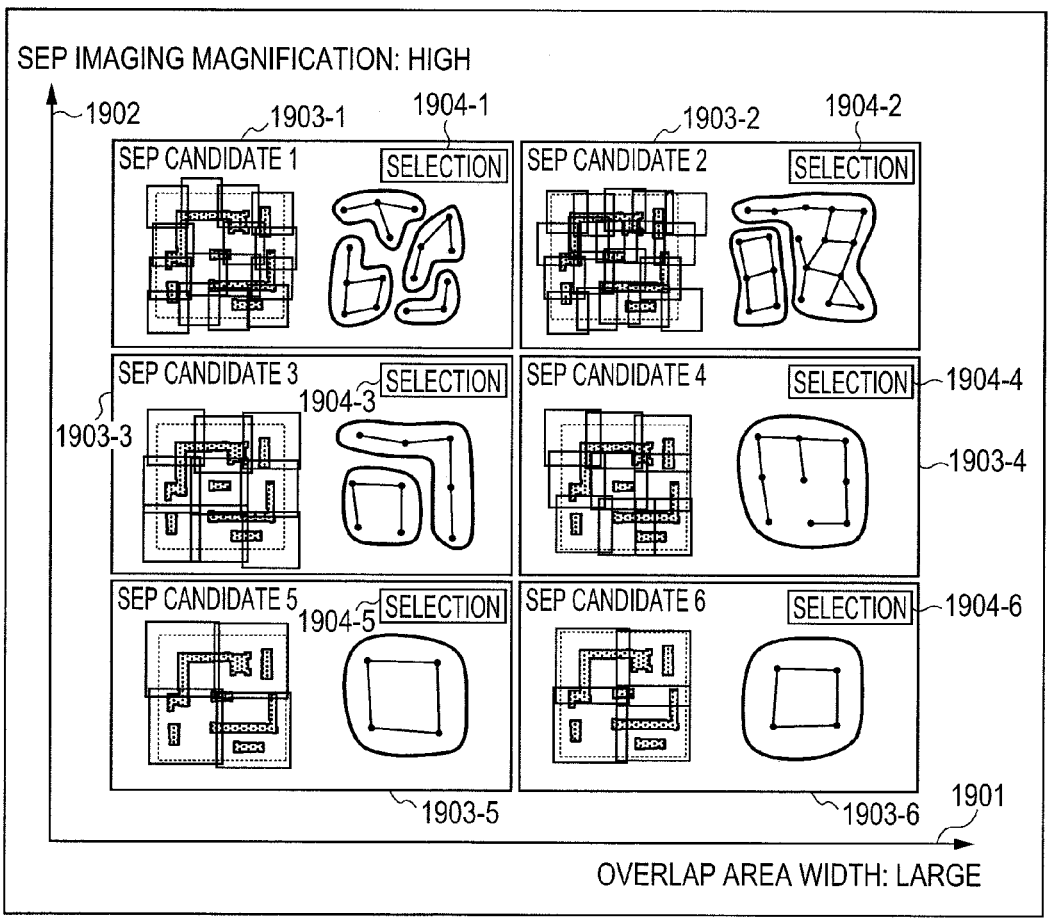
FIG. 18 is a diagram showing an example of the GUI screen image.

In addition, as a display method for SEP candidates, as shown in FIG. 18, user's request items (for example, an SEP imaging magnification, easiness of joining, an overlap volume between an inhibition area and overlap area, an inter-SEP overlap area width, or the like) may be marked on axes, and the positions at which the SEP candidates are displayed may be changed according to the axes. In FIG. 18, the overlap area width and SEP imaging magnification are marked on an X axis (1901) and Y axis (1902) respectively, and six SEP candidates (1903-1 1903-6) are displayed. A user depresses any of buttons 1904-1 to 1904-6 so as to select SEPs from among the displayed SEP candidates. In this example, results of having disposed the SEP candidates according to the values of two items of the overlap area width and SEP imaging magnification are two-dimensionally displayed. As a variation, results of having disposed the SEP candidates according to values of three arbitrary items may be two-dimensionally displayed.

5. Application to a Semiconductor Device Design/Fabrication Line and Process

An example of a system configuration when the present invention is applied to a semiconductor device design/fabrication line and process will be described in conjunction with FIG. 19A, FIG. 19B, and FIG. 20.

Figure 19A:
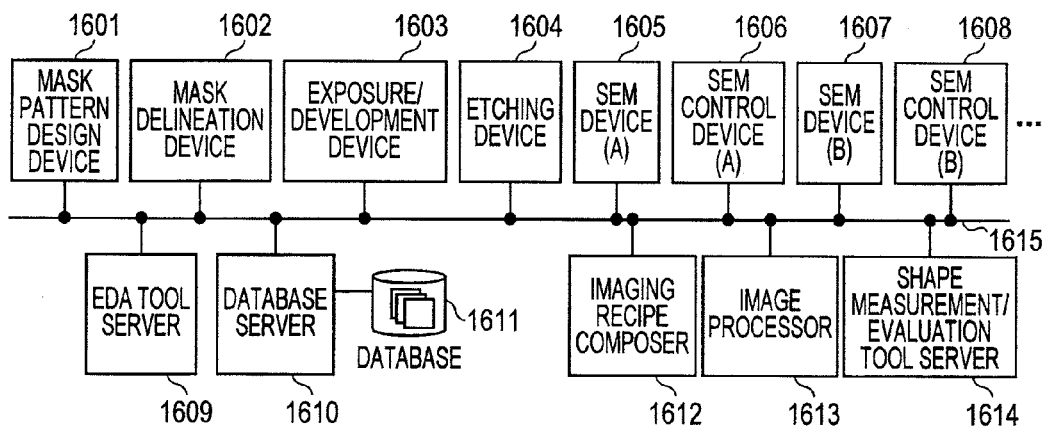
FIG. 19A is a block diagram showing a schematic configuration of a system in a case where a scanning electron microscope device in accordance with the present invention is adapted to a fabrication line for semiconductor devices.
Figure 20:
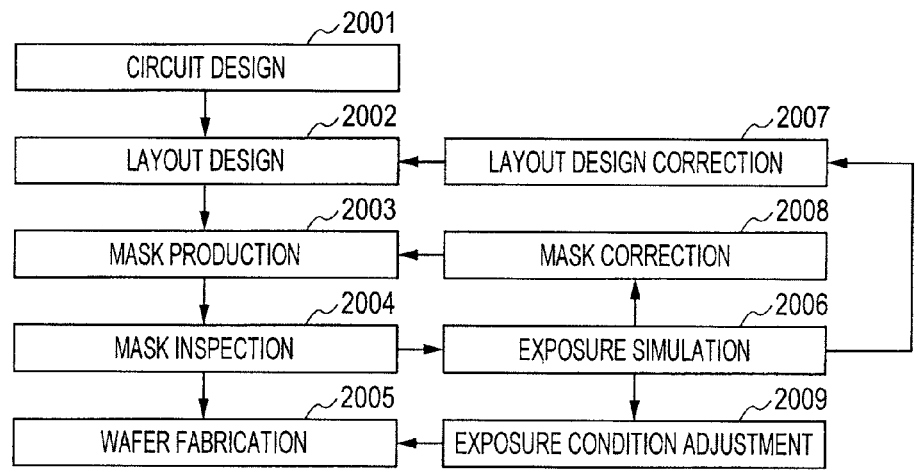
FIG. 20 is a flowchart signifying a flow of design and fabrication of semiconductor devices.

In FIG. 19A, reference numeral 1601 denotes a mask pattern design device, reference numeral 1602 denotes a mask delineation device, reference numeral 1603 denotes an exposure/development device for mask patterns onto a wafer, reference numeral 1604 denotes a wafer etching device, reference numerals 1605 and 1607 denote SEM devices, 1606 and 1608 denote SEM control devices for controlling the respective SEM devices, reference numeral 1609 denotes an electronic design automation (EDA) tool server, reference numeral 1610 denotes a database server, reference numeral 1611 denotes a storage in which a database is preserved, reference numeral 1612 denotes an imaging recipe composer, reference numeral 1613 denotes an image processor, and reference numeral 1614 denotes a shape measurement/evaluation tool server for produced pattern shapes. These components can transmit or receive information to or from one another over a network 1615.

The database server 1610 is accompanied by the storage 1611. Part or all of (a) a size and coordinates of an EP, (b) design information (mask design information (without or with an OPC) or wafer transfer pattern design information), (c) imaging recipe composition rules, (d) a composed imaging recipe (including SEPs and an imaging sequence), (e) picked up or produced images (SEP images, panoramic image), (f) outlines extracted from an image, (g) simulation patterns, and (h) a result of measurement/evaluation can be preserved or referenced while being linked with a product line, fabrication process, date, data acquisition device, and others.

In the drawing, the two SEM devices 1605 and 1607 are, as an example, connected on the network. In the present invention, an arbitrary number of SEM devices can share the same imaging recipe via the database server 1611. Once an imaging recipe is composed, the plural SEM devices can be operated. In addition, when the plural SEM devices share the same database, whether previous imaging or measurement has succeeded or not, or a cause of a failure can be promptly stored. Referencing this information would assist in composing a satisfactory imaging recipe.

Figure 19B:
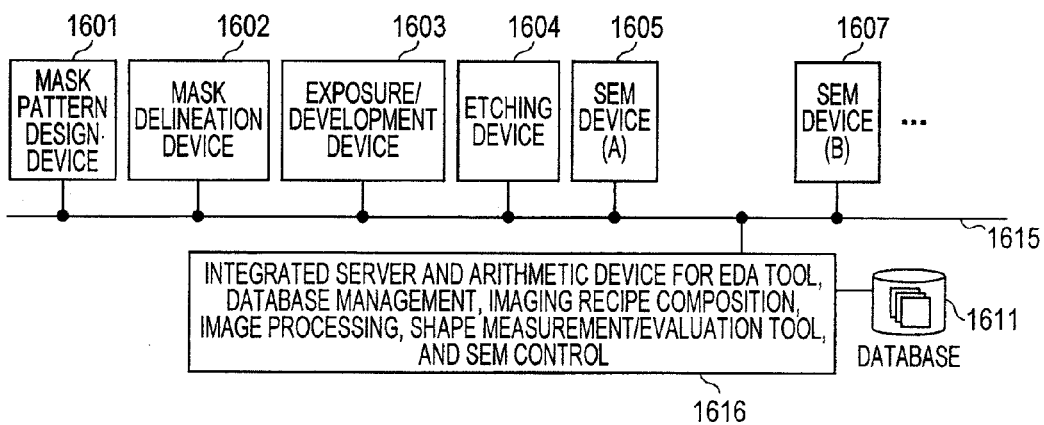
FIG. 19B is a block diagram showing a schematic configuration of a system in which an EDA tool server, a data server, an SEM control device (A), an SEM control device (B), an imaging recipe composer, an image processor, a shape measurement/evaluation tool server, and others, which are included in the system shown in FIG. 19A, are integrated into one device.

FIG. 19B shows an example of a device 1616 into which the SEM control device (A) 1606, SEM control device (B) 1608, EDA tool server 1609, database server 1160, imaging recipe composer 1612, image processor 1613, and shape measurement/evaluation tool server 1614, which are shown in FIG. 19A, are integrated. Like this example, arbitrary functions can be assigned to an arbitrary number of devices or integrated into one device.

In addition, a configuration having the EDA tool server 1609 and database server 1610 separated from the device 1616 in FIG. 19B is feasible.

Using the panoramic image described in the above embodiments, efficiency in semiconductor design/fabrication can be upgraded. FIG. 20 shows a semiconductor device design/fabrication flow. First, semiconductor circuit design is executed (step 2001). Thereafter, a layout of mask patterns is designed (step 2002). At this time, optical proximity correction (OPC) or the like can be performed on the patterns. Next, the mask is produced based on the layout (step 2003). The mask patterns are transferred (exposed) to a wafer in order to fabricate the wafer (step 2005).

According to an embodiment of the present invention, for example, after mask production (step 2003) is completed, a wide field-of-view and high-resolution SEM panoramic image produced by imaging the mask with an SEM is used to inspect the finished state of the mask over a wide range (step 2004). For example, mask pattern shapes extracted from the panoramic image are compared with design information on the mask in order to calculate a mask production error. In addition, a defect in any of the patterns on the mask can be detected.

In addition, prediction of pattern shapes to be transferred to a wafer with wide-range and high-resolution mask pattern shapes as an input can be highly precisely achieved by the exposure simulation (step 2006). Based on the result of the prediction from the exposure simulation, the patterns on the design of the layout of the mask can be corrected (step 2007), or the mask can be corrected (step 2008). The correction of the design of the layout includes correction of OPC pattern shapes. Effective OPC inspection/correction can be realized.

In addition, by adjusting fabrication parameters, which include an exposure condition, on the basis of the result of the prediction (step 2009), a dissociation between the transferred pattern shapes on the wafer and design shapes of wafer patterns can be minimized, and a high yield can be attained. Further, according to an embodiment of the present invention, a panoramic image of the wafer can be produced. From the panoramic image of the wafer, wide-range and high-resolution wafer pattern shapes can be obtained. By comparing the wafer pattern shapes with the design shapes of the wafer patterns, calculation of a mask transfer error or feedback to the fabrication parameters including the exposure conditions can be achieved.

In the foregoing embodiment, a method of acquiring wide-area outline information by extracting outlines of circuit patterns from a panoramic image after producing the panoramic image has been described. The present invention is not limited to the method. Alternatively, a group of outlines may be extracted from pickup images of plural SEPs, and the group of outlines may then be joined in order to acquire the wide-area outline information. In the foregoing embodiment, the system using the scanning electron microscopes (SEMs) has been described. The present invention is not limited to the system. The present invention can be adapted to a scanning charged-particle microscope such as a scanning ion microscope (SEIM) or a scanning transmission electron microscope (STEM).

According to an embodiment of the present invention, even when patterns are coarse, an SEP arrangement or SEP imaging magnification allowing all SEPs to be joined can be determined. In addition, even when the SEP arrangement allowing all SEPs to be joined cannot be determined, SEPs that satisfy user's request items as many as possible can be determined. By joining pickup images of the obtained SEPs, a wide-range high-resolution panoramic image (or wide-range high-resolution pattern outlines) can be acquired. Pattern information that has not been acquired from a conventional single high-magnification SEM image can be acquired from a high-magnification image of a wide field of view produced by joining plural high-magnification SEM images.

According to the present invention, shape information on patterns, which are produced on a mask and are necessary to perform simulation with an optical proximity effect added, over a relatively wide area can be acquired from a panoramic image obtained by observing the mask. Using the pattern shapes as an input, high-precision simulation prediction of pattern shapes to be transferred to a wafer can be achieved. In addition, by comparing the pattern shapes produced on the mask with design information on the mask, calculation of a fabrication error or feedback to fabrication conditions can be achieved.

In addition, pattern shapes produced on a wafer can be acquired from a panoramic image produced by observing the wafer. By comparing the pattern shapes with design information on patterns to be produced, calculation of a mask transfer error or feedback to fabrication parameters including exposure conditions can be achieved. Further, for a shape error that cannot be compensated by modifying the fabrication parameters, modification of mask patterns is performed in order to attain a high yield.

The invention may be embodied in other specific forms without departing from the spirit of essential characteristics thereof. The present embodiment is therefore to be considered in all respects as illustrative and not restrictive, the scope of the invention being indicated by the appended claims, rather than by the foregoing description, and all changes which come within the meaning and range of equivalency of the claims are therefore intended to be embraced therein.

REFERENCE SIGNS LIST

101 . . . semiconductor wafer 102 . . . electron optical system 103 . . . electron gun 104 . . . electron beam 105 . . . condenser lens 106 . . . deflector 107 . . . E×B deflector 108 . . . objective lens 109 . . . secondary electron detector 110,111 . . . backscattered electron detector 112-114 . . . A/D converter 115 . . . processing/control unit 116 . . . CPU 117 . . . image memory 118,126 . . . processing terminal 119 . . . stage controller 120 . . . deflection control unit 121 . . . stage 122 . . . imaging recipe composer 123 . . . image processor 124 . . . shape measurement/evaluation tool server 126 . . . database (storage) 302 . . . EP 303-1-303-4 . . . SEP 401-403:EP 407-1-407-9,408-1-408-9,409-1-409-9 . . . SEP 501 . . . EP 503-1-503-9 . . . SEP 601 . . . EP 603-1-603-9 . . . SEP 701 . . . EP 03,704,705-1-705-9 . . . SEP 902 . . . EP 903-1-903-4 . . . SEP 904-1-904-4 . . . pseudo SEM images 1002 . . . EP 1003 . . . inhibition area 1004-1-1004-4SEP 1006 . . . EP 1008-1-1008-5 . . . SEP 1102 . . . EP 1103-1-1103-5 . . . SEP 1202 . . . panoramic image 1203-1-1203-4 . . . group of SEP images 1501 . . . EP 1503-1-1503-9 . . . SEP 1506-1-1506-4 . . . SEP 1509-1-1509-4 . . . SEP 1601 . . . mask pattern design device 1602 . . . mask delineation device 1603 . . . exposure/development device 1604 . . . wafer etching device 1605,1607 . . . SEM device 1606,1608 . . . SEM control devices 1609 . . . EDA tool server 1160 . . . database server 1611 . . . database 1612 . . . imaging recipe composer 1613 . . . image processor 1614 . . . shape measurement/evaluation tool server 1615 . . . network 1616 . . . a device into which the SEM control device (A), SEM control device (B), EDA tool server, database server, imaging recipe composer, image processor, and shape measurement/evaluation tool server are integrated 1701 . . . window 1717 . . . button to calculate SEP candidate 1718 . . . box to set a number for SEP candidate 1719-1721 . . . boxes which present three SEP candidates calculated for the selected EP 1725-1727 . . . boxes which present SEP arrangements of the respective SEP candidates 1728 . . . SEP 1739-1741 . . . buttons for selecting SEP 1904-1-1904-6 . . . buttons for selecting SEP

The invention claimed is:

1. A scanning electron microscope device comprising:
a scanning electron microscope;
an imaging recipe composer configured to compose an imaging recipe for imaging a specimen, which has patterns formed on the surface thereof, using the scanning electron microscope;
an image processor configured to process an image of the specimen, which is obtained by imaging the specimen using the scanning electron microscope, on the basis of the imaging recipe composed by the imaging recipe composer;
a dimensional information extractor configured to extract dimensional information on a pattern, which is formed on the specimen, from the image of the specimen processed by the image processor;
an input/output unit that includes a display screen and inputs or outputs information configured to be processed by the image processor and dimensional information extractor and information processed thereby; and
a controller configured to control the microscope, imaging recipe composer, image processor, dimensional information extractor, and input/output unit,
wherein the imaging recipe composer configured to calculate first index values between adjacent overlapping imaging areas, which indicate propriety or ease of joining between the adjacent overlapping imaging areas which are divided from a high-magnification image acquisition area by using design information on the high-magnification image acquisition area designated on a low-magnification image of the specimen picked up by the scanning electron microscope and to calculate second index values between non-adjacent imaging areas using the first index values which indicate propriety or ease of joining of two arbitrary local imaging areas, and composing an imaging recipe using the calculated first and second index values,
wherein the controller configured to control the scanning electron microscope so as to allow the scanning electron microscope to image the local imaging areas at a high magnification on the basis of the imaging recipe composed by the imaging recipe composer,
wherein the image processor configured to produce a high-magnification wide-area image by joining the high-magnification images of the local imaging areas picked up by the scanning electron microscope; and
wherein the dimensional information extractor configured to extract a dimension of the pattern from the high-magnification wide-area image produced by the image processor, and
wherein the imaging recipe composer configured to determine propriety or ease of joining of two arbitrary local imaging areas from a line segment length of the pattern contained in an overlap area between the two arbitrary adjoining local imaging areas.

2. The scanning electron microscope device according to claim 1, wherein:
the imaging recipe composer configured to divide an area into a plurality of areas to divide the high-magnification image acquisition area into the plurality of areas in a plurality of cases;
the input/output unit configured to display the cases of division into a plurality of areas, which the imaging recipe composer has dealt with, side by side on the display screen; and
the controller configured to control the scanning electron microscope to allow the scanning electron microscope to image the divided areas on the bases of the case of division designated on the screen on which the cases are displayed side by side.

3. The scanning electron microscope device according to claim 1, wherein the imaging recipe composer configured to use image information on a high-magnification image acquisition area, which is designated on the screen on which the low-magnification image of the specimen is displayed, and design information on the designated high-magnification image acquisition area to divide the designated high-magnification image acquisition area into a plurality of areas so that adjoining areas overlap while containing part of the edge of the pattern.

4. The scanning electron microscope device according to claim 1, wherein the specimen is an exposure mask, and the patterns are patterns having undergone optical proximity correction.

5. A pattern dimension measuring method using a scanning electron microscope device, comprising:
imaging a specimen, which has patterns formed on the surface thereof, at a low magnification using a scanning electron microscope;
displaying the picked up low-magnification image of the specimen on a screen;
when design information on a high-magnification image acquisition area designated on the screen on which the low-magnification image is displayed is used to divide the designated high-magnification image acquisition area into a plurality of local imaging areas, calculating first index values between adjacent overlapping imaging areas and adjacent link information which indicate propriety or ease of joining between the adjacent overlapping imaging areas and second index values between non-adjacent imaging areas using the first index values which indicate propriety or ease of joining of images of arbitrary local imaging areas;
composing an imaging recipe for a group of local imaging areas, which includes imaging areas of the plurality of images and an imaging magnification, on the basis of the calculated first and second index values which indicate proprietary or ease of joining of the group of local imaging areas;
imaging the divided local imaging areas using the scanning electron microscope on the basis of the composed imaging recipe so as to acquire high-magnification images of the local imaging areas;
joining the picked up high-magnification images of the respective local imaging areas so as to produce a high-magnification wide-area image; and
extracting a dimension of the pattern from the produced high-magnification wide-area image.

6. The pattern dimension measuring method using a scanning electron microscope device as set forth in claim 5, wherein the high-magnification image acquisition area is divided into a plurality of areas in a plurality of cases, the plurality of cases of division are displayed side by side on the display screen, the divided areas are imaged at a high magnification using the scanning electron microscope on the basis of the case of division designated on the screen on which the cases are displayed.

7. The pattern dimension measuring method using a scanning electron microscope device as set forth in claim 5, wherein at a step of composing the imaging recipe, image information on a high-magnification image acquisition area, which is designated on the screen on which the low-magnification image of the specimen is displayed, and design information on the designated high-magnification image acquisition area are used to divide the designated high-magnification image acquisition area into a plurality of areas so that adjoining areas overlap while containing part of the edge of the pattern.

8. The scanning electron microscope device as set forth in claim 1, wherein the imaging recipe composer configured to determine imaging areas and imaging magnitudes of the plural local areas based on the arbitrary link information and configured to compose the imaging recipe including the determined imaging areas and imaging magnitudes.

9. The pattern dimension measuring method using a scanning electron microscope device as set forth in claim 5, wherein the imaging recipe composer determines imaging areas and imaging magnitudes of the plural local areas based on the arbitrary link information and composing the imaging recipe including the determined imaging areas and imaging magnitudes.

* * * * *